United States Patent
Park et al.

(10) Patent No.: US 12,328,865 B2
(45) Date of Patent: Jun. 10, 2025

(54) SEMICONDUCTOR DEVICE AND METHOD OF FABRICATING THE SAME

(71) Applicant: Samsung Electronics Co., Ltd., Suwon-si (KR)

(72) Inventors: Jiwoon Park, Suwon-si (KR); Young-Geun Park, Suwon-si (KR); Hojin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 267 days.

(21) Appl. No.: 17/837,314

(22) Filed: Jun. 10, 2022

(65) Prior Publication Data
US 2023/0164976 A1     May 25, 2023

(30) Foreign Application Priority Data
Nov. 24, 2021   (KR) .................. 10-2021-0163735

(51) Int. Cl.
*H10B 12/00*     (2023.01)

(52) U.S. Cl.
CPC ......... *H10B 12/315* (2023.02); *H10B 12/033* (2023.02); *H10B 12/34* (2023.02)

(58) Field of Classification Search
CPC .... H10B 12/315; H10B 12/033; H10B 12/34; H10B 12/053; H10B 12/0335; H10B 12/36; H01L 21/823475
See application file for complete search history.

(56) References Cited

U.S. PATENT DOCUMENTS

| | | |
|---|---|---|
| 6,649,536 B2 | 11/2003 | Chen |
| 7,144,772 B2 | 12/2006 | Lee et al. |
| 7,655,519 B2 | 2/2010 | Chung et al. |
| 7,811,895 B2 | 10/2010 | Iijima |
| 8,105,913 B2 | 1/2012 | Jung |
| 8,652,927 B2 | 2/2014 | Malhotra et al. |
| 10,650,978 B2 | 5/2020 | Chavan et al. |
| 11,665,452 B2 | 5/2023 | Baek et al. |

(Continued)

FOREIGN PATENT DOCUMENTS

| | | | | |
|---|---|---|---|---|
| CN | 111863727 A | * | 10/2020 | ....... H01L 27/10814 |
| EP | 3598501 A2 | | 1/2020 | |

(Continued)

OTHER PUBLICATIONS

Solovan—Inorganic Materials No. 1, pp. 40-45, 2014 (Year: 2014).*
Loehman—Journal of Non-crystalline Solids 56 (1983) 123-134 (Year: 1983).*

*Primary Examiner* — Kretelia Graham
*Assistant Examiner* — Jaesun Lee
(74) *Attorney, Agent, or Firm* — Harness, Dickey & Pierce, P.L.C.

(57) ABSTRACT

Disclosed is a semiconductor device comprising a substrate, a contact structure that penetrates the substrate, a bottom electrode on the substrate and connected to the contact structure, a dielectric layer that covers the bottom electrode, and a top electrode on the bottom electrode. The dielectric layer separates the top electrode from the bottom electrode. The contact structure includes a lower conductive pattern and an upper conductive pattern on the lower conductive pattern. The upper conductive pattern includes a nitride of a first metal implanted with a dopant.

18 Claims, 21 Drawing Sheets

(56) References Cited

U.S. PATENT DOCUMENTS

| | | |
|---|---|---|
| 2001/0000923 A1 | 5/2001 | Takemura |
| 2003/0107076 A1 | 6/2003 | Lin et al. |
| 2003/0205729 A1 | 11/2003 | Basceri et al. |
| 2007/0057305 A1 | 3/2007 | Oates et al. |
| 2010/0240191 A1 | 9/2010 | Chung et al. |
| 2014/0220772 A1* | 8/2014 | Lakshmanan ..... H01L 21/76862 |
| | | 438/597 |
| 2015/0035103 A1 | 2/2015 | Inoue |
| 2015/0061134 A1* | 3/2015 | Lee ................. H10B 12/34 |
| | | 257/751 |
| 2015/0294971 A1 | 10/2015 | Sapra et al. |
| 2018/0158828 A1* | 6/2018 | Han ................. H01L 21/76804 |
| 2019/0267383 A1 | 8/2019 | Rocklein et al. |
| 2019/0312043 A1* | 10/2019 | Mihara ............. H01L 29/40117 |
| 2020/0091303 A1* | 3/2020 | Nam ................. H01L 29/42368 |
| 2021/0223213 A1* | 7/2021 | Matsuda ............ B06B 1/0622 |

FOREIGN PATENT DOCUMENTS

| | | |
|---|---|---|
| KR | 10-2004-0092021 A | 11/2004 |
| TW | 543185 B | 7/2003 |
| TW | 201539769 A | 10/2015 |
| TW | 201941406 A | 10/2019 |
| TW | 202006961 A | 2/2020 |
| TW | 202114192 A | 4/2021 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0163735 filed on Nov. 24, 2021 in the Korean Intellectual Property Office, the disclosure of which is hereby incorporated by reference in its entirety.

BACKGROUND

1. Field

The present inventive concepts relate to a semiconductor device and a method of fabricating the same, and more particularly, to a semiconductor device including a capacitor and a method of fabricating the same.

2. Description of the Related Art

Semiconductor devices have an important role in the electronic industry because of their small size, multi-functionality, and/or low fabrication cost. Semiconductor devices may be included in and/or categorized as any one of semiconductor memory devices storing logic data, semiconductor logic devices processing operations of logic data, and hybrid semiconductor devices having both memory and logic elements.

Recently, the demand for high speed and low consumption of electronic products requires that semiconductor devices embedded in the electronic products should have high operating speed and/or lower operating voltage. For satisfying the above demand, semiconductor devices have been more highly integrated. The high integration of semiconductor devices may cause to reduce reliability of the semiconductor devices. However, the high reliability of semiconductor devices has been increasingly required with the advance in the electronic industry. Therefore, various research has been conducted for enhancing the reliability of semiconductor devices.

SUMMARY

Some embodiments of the present inventive concepts provide a semiconductor device whose operating stability is improved and method of fabricating the same.

Some embodiments of the present inventive concepts provide a semiconductor device whose electrical properties are increased and a method of fabricating the same.

According to some embodiments of the present inventive concepts, a semiconductor device may comprise: a substrate; a contact structure at least partially penetrating the substrate, the contact structure including a lower conductive pattern and an upper conductive pattern on the lower conductive pattern, the upper conductive pattern including a nitride of a first metal implanted with a dopant; a bottom electrode on the substrate and connected to the contact structure; a top electrode on the bottom electrode; and a dielectric layer separating the top electrode from the bottom electrode.

According to some embodiments of the present inventive concepts, a semiconductor device may comprise: a device isolation pattern defining an active region in a semiconductor substrate; a word line crossing the active region in the semiconductor substrate; a first impurity region in the active region and on one side of the word line; a second impurity region in the active region and on another side of the word line; a bit line crossing the semiconductor substrate and connected to the first impurity region; a landing pad on the second impurity region; a storage node contact connecting the landing pad to the second impurity region; a bottom electrode on the landing pad; and a dielectric layer that covers the bottom electrode. The landing pad may include a first conductive pattern including a first metal; a second conductive pattern on the first conductive pattern and including of a nitride of a second metal; and an interface layer on a top surface of the second conductive pattern. The interface layer may include an oxynitride of the second metal.

According to some embodiments of the present inventive concepts, a method of fabricating a semiconductor device may comprise: forming a metal layer on a substrate; forming a metal nitride layer on the metal layer; implanting a dopant into an upper portion of the metal nitride layer to form an interface layer; patterning the interface layer, the metal nitride layer, and the metal layer to form a contact structure; forming a mold layer on the substrate; forming a hole that penetrates the mold layer to expose a top surface of the interface layer; and forming in the hole a bottom electrode in contact with the top surface of the interface layer. The bottom electrode may include a conductive oxide.

DETAIL PORTIONED DESCRIPTION OF EMBODIMENTS

Figure 1:
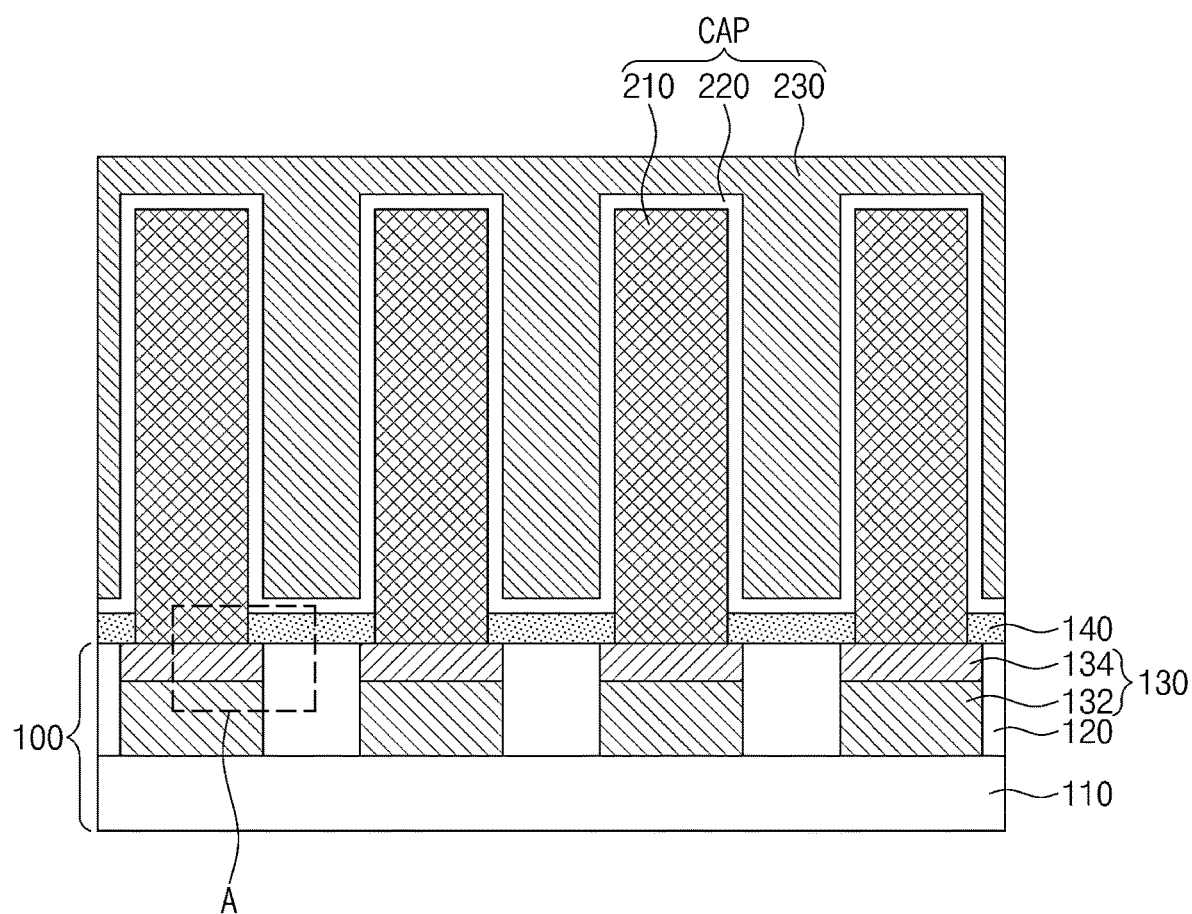
FIG. 1 illustrates a cross-sectional view showing a semiconductor device according to some embodiments of the present inventive concepts.

The following will now describe a semiconductor device according to the present inventive concepts with reference to the accompanying drawings. wherein like reference numerals refer to like elements throughout. In this regard, the present embodiments may have different forms and should not be construed as being limited to the descriptions set forth herein. Throughout the drawings, the size or thickness of each constituent element illustrated in the drawings may be exaggerated for convenience of explanation and clarity.

Terms such as "first" and "second" are used herein merely to describe a variety of constituent elements, but the constituent elements are not limited by the terms. Such terms are used only for the purpose of distinguishing one constituent element from another constituent element.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
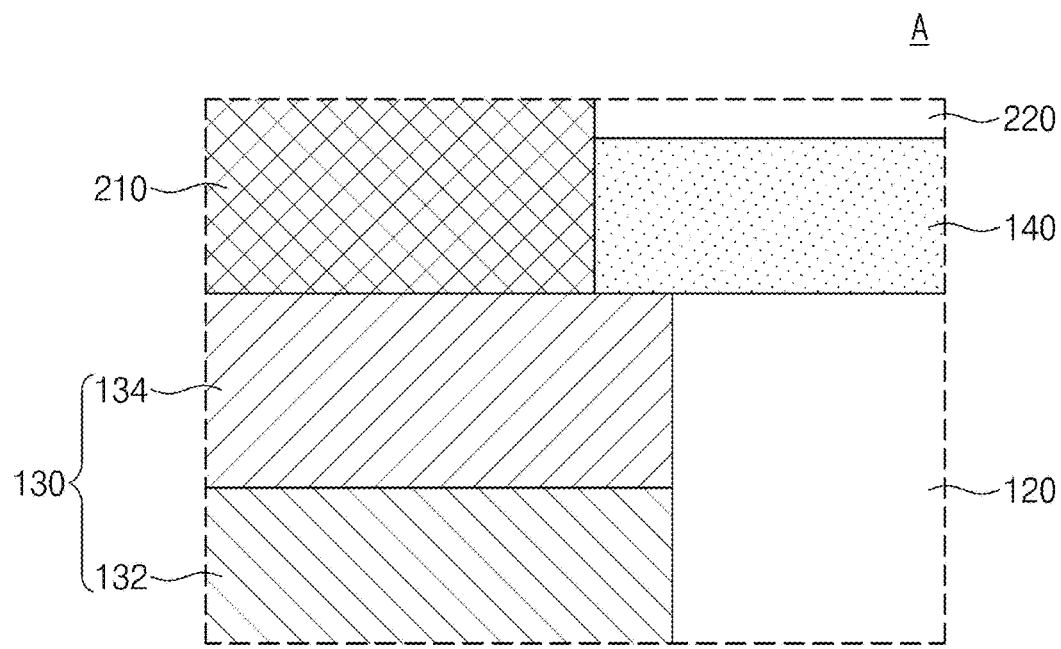
FIGS. 2 to 6 illustrate enlarged views showing section A of FIG. 1.
Figure 3:
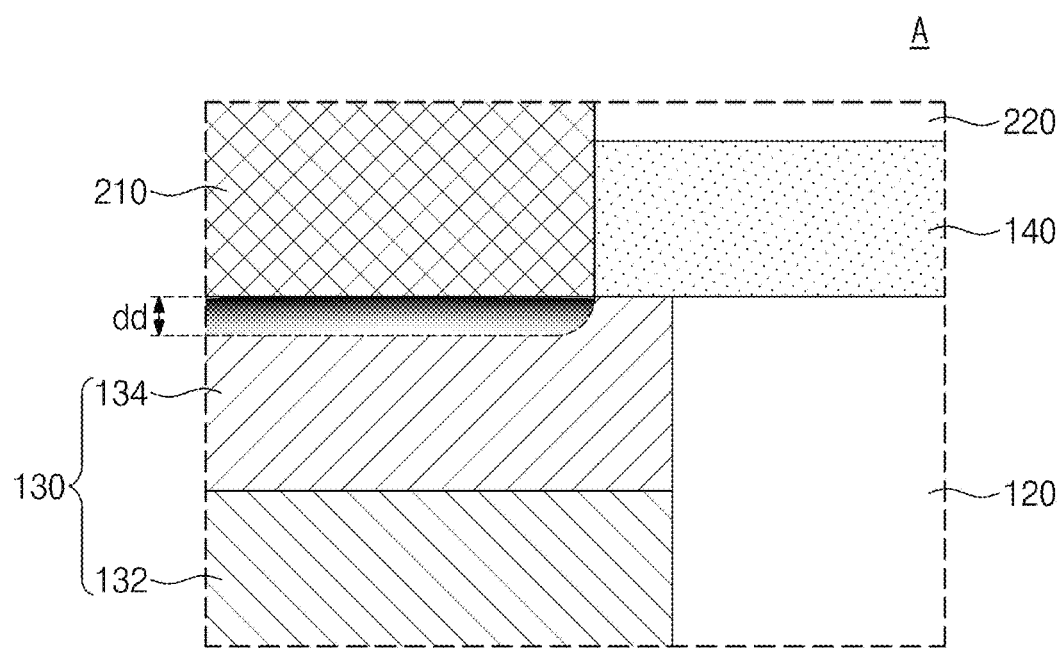

FIG. 1 illustrates a cross-sectional view showing a semiconductor device according to some embodiments of the present inventive concepts. FIGS. 2 and 3 illustrate enlarged views showing section A of FIG. 1.

Referring to FIG. 1, a substrate 100 may be provided. The substrate 100 may include a base layer 110 and an interlayer dielectric layer 120 on the base layer 110.

The base layer 110 may be (and/or include) at least one of a semiconductor substrate, a semiconductor wafer, a semiconductor layer, and/or the like. For example, the base layer 110 may be a single-crystalline silicon substrate or a polycrystalline silicon substrate. Alternatively, the base layer 110 may include a semiconductor substrate, such as a germanium (Ge) and/or a silicon-germanium (Si—Ge) substrate.

Although not shown, the base layer 110 may be provided with a semiconductor element such as a transistor. For example, in some examples, a device isolation layer may be disposed in the base layer 110. The device isolation layer may define active regions in the base layer 110. The base layer 110 may be provided with word lines that are buried therein. The word lines may be insulated from the base layer 110 by a gate dielectric layer and a capping pattern. Source/drain regions may be provided to include impurity regions disposed in the base layer 110 on opposite sides of each of the word lines. Bit lines may be electrically connected to impurity regions each of which is provided on one side of the word line. The example embodiments, however, are not limited thereto, and the base layer 110 may be provided with one or more of a semiconductor element, an electronic element, a wiring line, a circuit, and/or the like.

The interlayer dielectric layer 120 may be disposed on the base layer 110. The interlayer dielectric layer 120 may include a dielectric material. In some examples, the interlayer dielectric layer 120 may include a composite of a material included in the base layer 110. For example, when the base layer 110 is formed of (and/or includes) a silicon (Si) substrate, the interlayer dielectric layer 120 may include at least one of silicon oxide (SiO), silicon nitride (SiN), and/or silicon oxynitride (SiON).

The interlayer dielectric layer 120 may be provided with contact structures 130 therein. The contact structures 130 may be provided in holes that vertically penetrate the interlayer dielectric layer 120. Each of the contact structures 130 may penetrate the interlayer dielectric layer 120 to connect to the base layer 110. For example, the contact structures 130 may be electrically connected to a semiconductor element of the base layer 110. For example, the contact structures 130 may be electrically connected to corresponding impurity regions. In some examples, the corresponding impurity regions may not be connected to the word lines provided in the base layer 110. A detailed example configuration of the contact structures 130 will be discussed in detail below.

An etch stop layer 140 may be disposed on the interlayer dielectric layer 120. The etch stop layer 140 may be (and/or include) a dielectric layer. For example, when the base layer 110 is formed of (and/or includes) a silicon (Si) substrate, the etch stop layer 140 may include at least one of a silicon nitride (SiN) layer, a silicon boron nitride (SiBN) layer, a silicon carbon nitride (SiCN) layer, and/or a multiple layer thereof.

The etch stop layer 140 may be provided thereon with bottom electrodes 210. The bottom electrodes 210 may penetrate the etch stop layer 140 to correspondingly contact the contact structures 130. The bottom electrodes 210 may each have a pillar shape. For example, the bottom electrodes 210 may have a circular plug shape when viewed in a plan view. In some examples, when viewed in the plan view, the bottom electrodes 210 may be disposed to constitute a honeycomb shape. For example, six bottom electrodes 210 may be disposed to constitute a hexagonal shape around a (e.g., one) bottom electrode 210. Alternatively, the bottom electrodes 210 may be disposed to constitute a grid shape when viewed in the plan view. However, the example embodiments are not limited thereto, and the planar arrangement of the bottom electrodes 210 may be variously changed. The bottom electrodes 210 may be (and/or include) oxide electrodes. For example, the oxide electrode may be formed of metal oxide and capable of being used as an electrode because of its high conductivity. For example, the bottom electrodes 210 may include at least one of strontium ruthenate ($SrRuO_3$) and/or tin oxide ($SnO_2$) doped with tantalum (Ta). Alternatively, the bottom electrodes 210 may include at least one of a metal, a metal oxide, and/or doped polysilicon.

Although not shown, support patterns (not shown) may be provided between neighboring bottom electrodes 210. The support patterns may connect the neighboring bottom electrodes 210 to each other, and thus the neighboring bottom electrodes 210 may be supported by the support patterns. The support pattern may be (and/or include) a dielectric material layer, for example, a silicon nitride (SiN) layer, a silicon boron nitride (SiBN) layer, a silicon carbon nitride (SiCN) layer, and/or a multiple layer thereof. In some examples, the support patterns may be omitted.

A dielectric layer 220 may be disposed on the bottom electrodes 210. The dielectric layer 220 may have a uniform thickness to cover surfaces of the bottom electrodes 210. When the support pattern is provided between the bottom electrodes 210, the dielectric layer 220 may have a uniform thickness to cover a surface of the support pattern. The dielectric layer 220 may include a dielectric material. The dielectric layer 220 may include a high-k dielectric material. For example, the dielectric layer 220 may include a metal oxide layer such as an aluminum oxide ($Al_2O_3$) layer and/or a multiple layer including the same.

A top electrode 230 may be disposed on the dielectric layer 220. The top electrode 230 may include, for example, at least one of titanium nitride (TiN), a metal such as tungsten (W), impurity-doped polysilicon, a multiple layer thereof, and/or the like. The bottom electrodes 210, the dielectric layer 220, and the top electrode 230 may constitute a plurality of capacitors CAP.

The bottom electrodes 210 may be connected through the contact structures 130 to a semiconductor element of the base layer 110. For example, the contact structures 130 may be connection structures that connect the semiconductor element to the capacitors CAP. The following will describe in detail an example of a single contact structure 130.

Referring to FIGS. 1 and 2, each contact structure 130 may include a lower conductive pattern 132 and an upper conductive pattern 134.

The lower conductive pattern 132 may fill a lower portion of a hole formed in the interlayer dielectric layer 120. The lower conductive pattern 132 may be connected to the semiconductor element of the base layer 110. The lower conductive pattern 132 may include a first metal. For example, the first metal may include tungsten (W). Alternatively, the lower conductive pattern 132 may include at least one of impurity-doped polysilicon, titanium nitride (TiN), and/or tungsten (W).

The upper conductive pattern 134 may be disposed on the lower conductive pattern 132. The upper conductive pattern 134 may fill an upper portion of the hole formed in the interlayer dielectric layer 120. The upper conductive pattern 134 may have a flat plate shape. The upper conductive pattern 134 may be in contact with the lower conductive pattern 132. For example, the upper conductive pattern 134 may have a bottom surface in contact with an entire top surface of the lower conductive pattern 132. The upper conductive pattern 134 may be in contact with one bottom electrode 210. For example, the upper conductive pattern 134 may have a top surface in contact with an entire bottom surface of the one bottom electrode 210. The upper conductive pattern 134 may separate the bottom electrode 210 form the lower conductive pattern 132. The upper conductive pattern 134 may have a thickness of greater than about 10 Å. For example, the upper conductive pattern 134 may have a thickness of about 10 Å to about 30 Å.

The upper conductive pattern 134 may include conductive metal nitride. For example, the upper conductive pattern 134 may include a nitride of a second metal. The second metal may be different from the first metal. For example, the second metal may include titanium (Ti) and/or the upper conductive pattern 134 may include titanium nitride (TiN). The upper conductive pattern 134 may further contain a dopant. For example, the upper conductive pattern 134 may be formed of a nitride of the second metal into which the dopant is implanted. The dopant may be a material with a valence electron number different from that of the second metal. For example, the dopant may include niobium (Nb), tantalum (Ta), vanadium (V), and/or the like.

According to some embodiments, as illustrated in FIG. 3, the upper conductive pattern 134 may further contain oxygen (O). The oxygen may be a material diffused into the upper conductive pattern 134 from the bottom electrode 210 which is an oxide electrode. Therefore, an oxygen concentration may decrease with increasing distance from an interface between the upper conductive pattern 134 and the bottom electrode 210. For example, the oxygen concentration may decrease in an inward direction from the top surface of the upper conductive pattern 134. The oxygen may diffuse to a depth dd from the bottom electrode 210 into the upper conductive pattern 134, and the depth dd may be less than a thickness of the upper conductive pattern 134. The thickness of the upper conductive pattern 134 may be set to be greater than the diffusion depth dd of the oxygen. Therefore, the diffusion of oxygen into the lower conductive pattern 132 may be mitigated and/or prevented. For example, the upper conductive pattern 134 may be an interface layer for blocking oxygen diffusion from the bottom electrode 210 into the lower conductive pattern 132 and mitigating and/or preventing a reduction in electrical resistance. The example embodiments, however, are not limited thereto. Based on a process for forming the bottom electrode 210, the oxygen concentration may be uniform in a certain region in the upper conductive pattern 134. Alternatively, as illustrated in FIG. 2, based on either a process for forming the bottom electrode 210 and/or a material of the upper conductive pattern 134 and/or the bottom electrode 210, no oxygen may diffuse into the upper conductive pattern 134 and no oxygen atoms may be substantially contained in the upper conductive pattern 134.

In FIG. 3, the upper conductive pattern 134 is illustrated to have an oxygen diffusion region that is visually apparent, but this does not mean that the oxygen diffusion portion is a component separated from the upper conductive pattern 134. For example, the oxygen diffusion region may be an area of which oxygen concentration is different from that of any other region in the upper conductive pattern 134, and no visible interface may be provided between the oxygen diffusion region of the upper conductive pattern 134 and the any other region of the upper conductive pattern 134.

According to some embodiments of the present inventive concepts, the upper conductive pattern 134 may be implanted with a dopant with a valence electron number different from the second metal included in the upper conductive pattern 134. Therefore, the quantity of electric charge and/or electric conductivity between the bottom electrode 210 and the contact structure 130 may increase. A semiconductor device may thus improve in electrical properties.

In some example embodiments, as the bottom electrode 210 is formed of an oxide electrode, oxygen atoms may diffuse into the upper conductive pattern 134 and the oxygen diffusion may increase resistance of the upper conductive pattern 134. However, according to some embodiments of the present inventive concepts, the upper conductive pattern 134 may be implanted with dopants which may increase the quantity of electric charge and/or electric conductivity. Therefore, it may be possible to alleviate a reduction in resistance of the upper conductive pattern 134 due to the oxygen diffusion. In addition, because the upper conductive pattern 134 contains oxygen that is diffused from the bottom electrode 210, it may be possible to mitigate and/or prevent the oxygen diffusion into the lower conductive pattern 132 formed of only the first metal. Therefore, the lower conductive pattern 132 may be prevented from resistance increase and/or electrical short due to the formation of an oxide of the first metal. Accordingly, a semiconductor device may increase in electrical properties and driving reliability.

Figure 4:
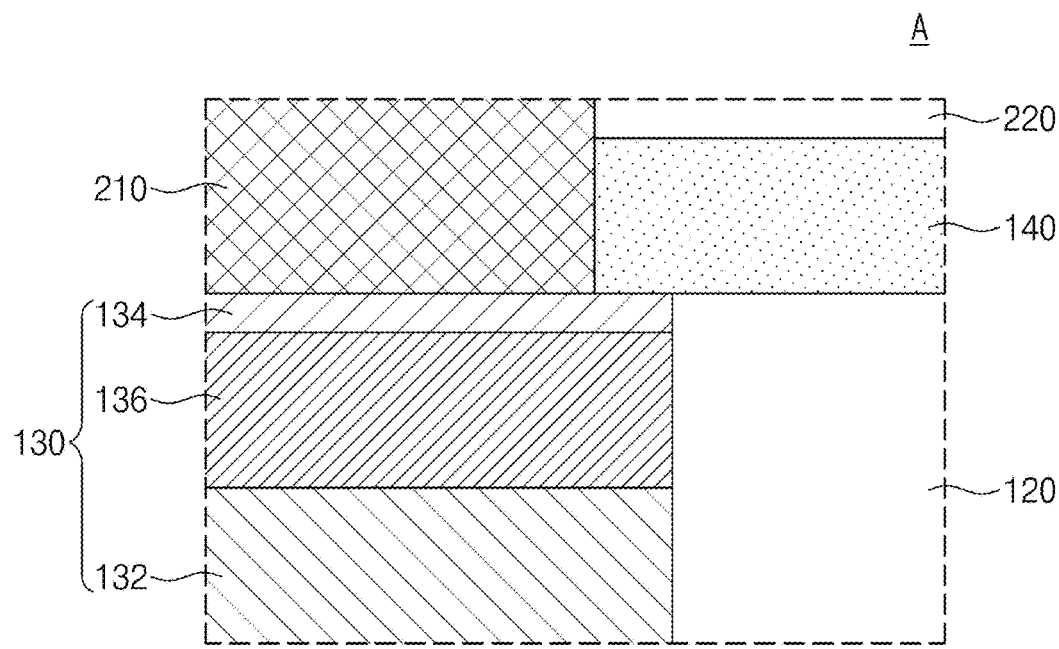
Figure 5:
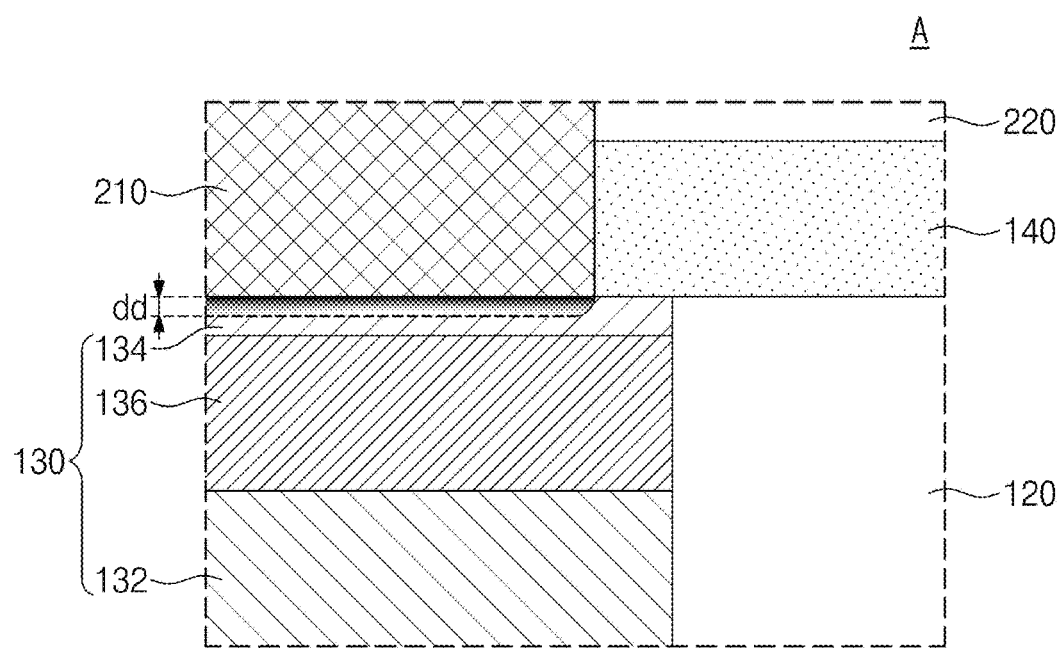
Figure 6:
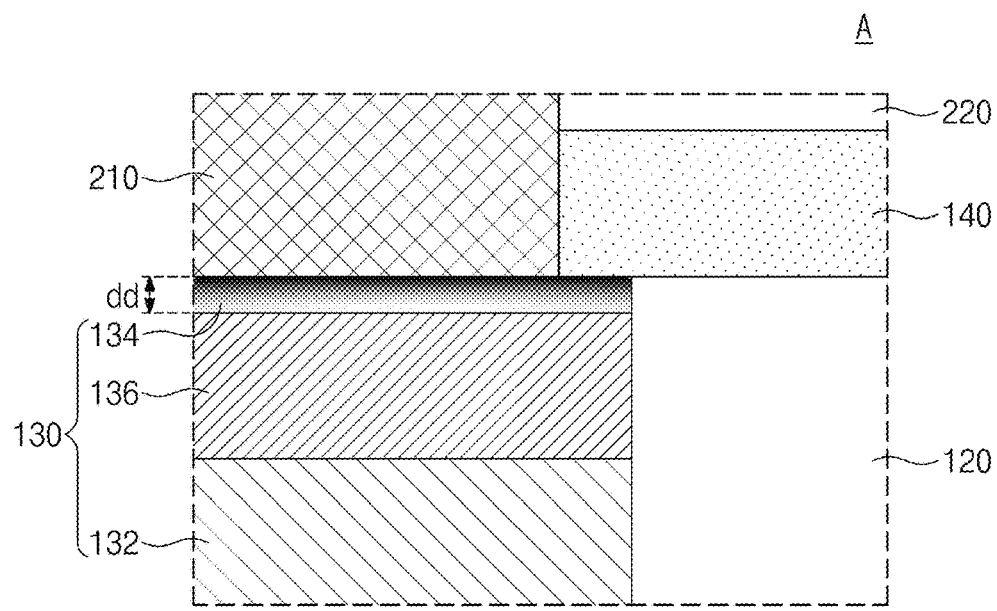

FIGS. 4 to 6 illustrate enlarged views of section A depicted in FIG. 1, showing a semiconductor device according to some embodiments of the present inventive concepts. In the embodiments that follow, components the same as and/or substantially similar to those discussed with reference to FIGS. 1 to 3 are allocated the same reference numerals thereto, and a repetitive explanation thereof will be omitted or abridged for convenience of description. The following description will focus on differences between the embodiments of FIGS. 1 to 3 and other embodiments described below.

Referring to FIGS. 1 and 4, each contact structure 130 may have a lower conductive pattern 132, an intermediate conductive pattern 136, and an upper conductive pattern 134.

The intermediate conductive pattern 136 may be provided between the lower conductive pattern 132 and the upper conductive pattern 134. The intermediate conductive pattern 136 may have a flat plate shape. The intermediate conductive pattern 136 may be in contact with the lower conductive pattern 132. For example, the intermediate conductive pattern 136 may have a bottom surface in contact with an entire top surface of the lower conductive pattern 132. The intermediate conductive pattern 136 may be in contact with the upper conductive pattern 134. For example, the intermediate conductive pattern 136 may have a top surface in contact with an entire bottom surface of the upper conductive pattern 134. The intermediate conductive pattern 136 may separate the upper conductive pattern 134 from the lower conductive pattern 132. The upper conductive pattern 134 may have a thickness of greater than about 30 Å.

The intermediate conductive pattern 136 may be formed of a material similar to that of the upper conductive pattern 134. For example, the intermediate conductive pattern 136 and the upper conductive pattern 134 may share the second metal. For example, the intermediate conductive pattern 136 may include a nitride of the second metal. The intermediate conductive pattern 136 may include titanium nitride (TiN). The upper conductive pattern 134 may further contain a dopant, and the intermediate conductive pattern 136 may not contain a dopant. The intermediate conductive pattern 136 may be formed of a nitride of the second metal implanted with no dopant, and the upper conductive pattern 134 may be formed of a nitride of the second metal implanted with the dopant. For example, the intermediate conductive pattern 136 may be formed of a nitride of the second metal, and the upper conductive pattern 134 may correspond to an interface layer formed by implanting the dopant into an upper portion of the intermediate conductive pattern 136. Though illustrated as being clearly distinct, the example embodiments are not limited thereto. For example, in some example embodiments, a dopant concentration may decrease with increasing distance from an interface between the upper conductive pattern 134 and the bottom electrode 210.

The intermediate conductive pattern 136 may not contain oxygen (O). The oxygen may be a material diffused into the upper conductive pattern 134 from the bottom electrode 210 which is an oxide electrode. In this configuration, the oxygen may be blocked by the upper conductive pattern 134 and may not diffuse into the intermediate conductive pattern 136.

According to some embodiments, as illustrated in FIG. 5, the upper conductive pattern 134 may further contain oxygen (O). An oxygen concentration may decrease with increasing distance from an interface between the upper conductive pattern 134 and the bottom electrode 210. For example, the oxygen concentration may decrease in a direction from the top surface of the upper conductive pattern 134 toward an inside of the upper conductive pattern 134. The oxygen may diffuse to a depth dd from the bottom electrode 210 into the upper conductive pattern 134, and the depth dd may be less than a thickness of the upper conductive pattern 134. The thickness of the upper conductive pattern 134 may be set to be greater than the diffusion depth dd of the oxygen. Therefore, the diffusion of oxygen into the intermediate conductive pattern 136 may be mitigated and/or prevented. For example, the upper conductive pattern 134 may be an interface layer for blocking oxygen diffusion from the bottom electrode 210 into the lower conductive pattern 132 and mitigated and/or preventing a reduction in electrical resistance.

Alternatively, as illustrated in FIG. 6, the diffusion depth dd of the oxygen from the bottom electrode 210 into the upper conductive pattern 134 may be the same as a thickness of the upper conductive pattern 134. For example, the oxygen may diffuse into an entirety of the upper conductive pattern 134.

Figure 7:
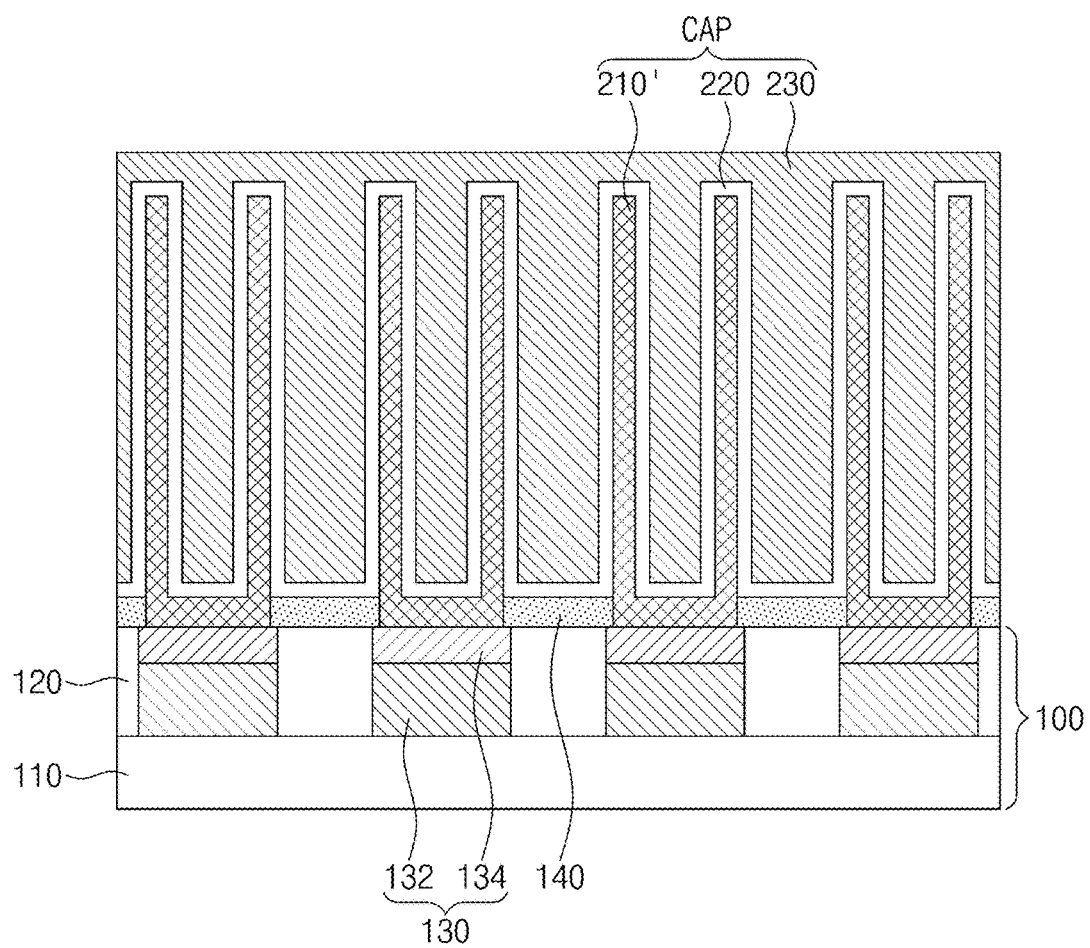
FIG. 7 illustrates a cross-sectional view showing a semiconductor device according to some embodiments of the present inventive concepts.

FIG. 7 illustrates a cross-sectional view showing a semiconductor device according to some embodiments of the present inventive concepts.

Referring to FIG. 7, bottom electrodes 210' may each have a hollow cup shape and/or a cylindrical shape. For example, the bottom electrode 210' may each include a floor portion and a sidewall portion that vertically extends from the floor portion along an edge of the bottom portion. The floor portion of the bottom electrode 210' may be in contact with the upper conductive pattern 134 of the contact structure 130.

Although not shown, support patterns may be provided between neighboring bottom electrodes 210'. The support patterns may be interposed between outer sidewalls of the bottom electrodes 210'.

The dielectric layer 220 may conformally cover the bottom electrodes 210'. For example, the dielectric layer 220 may cover not only the outer sidewalls but also inner sidewall of the bottom electrodes 210'. The dielectric layer 220 may be in contact with the inner sidewalls of the bottom electrodes 210'.

The top electrode 230 may cover the bottom electrodes 210'. The top electrode 230 may extend into internal spaces of the bottom electrodes 210'. For example, on the dielectric layer 220, portions of the top electrode 230 may fill the internal spaces of the bottom electrodes 210'.

Other configurations may be the same and/or substantially similar to those discussed with reference to FIGS. 1 to 6.

Figure 8:
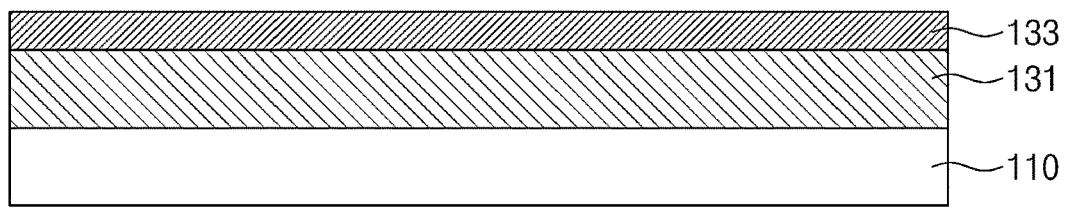
FIGS. 8 and 18 illustrate cross-sectional views showing a method of fabricating a semiconductor device according to some embodiments of the present inventive concepts.
Figure 17:
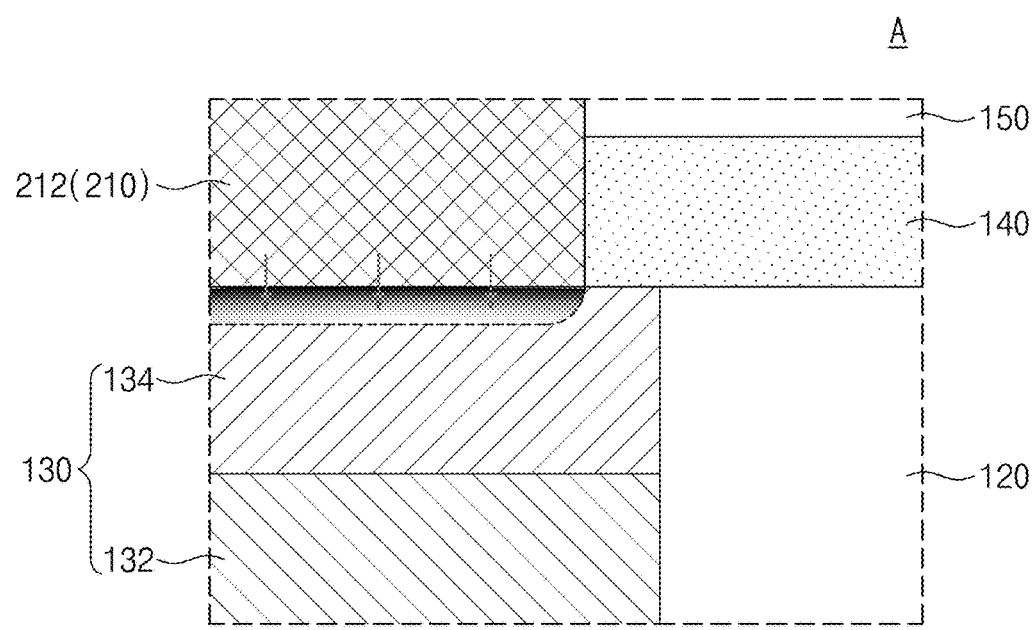
Figure 18:
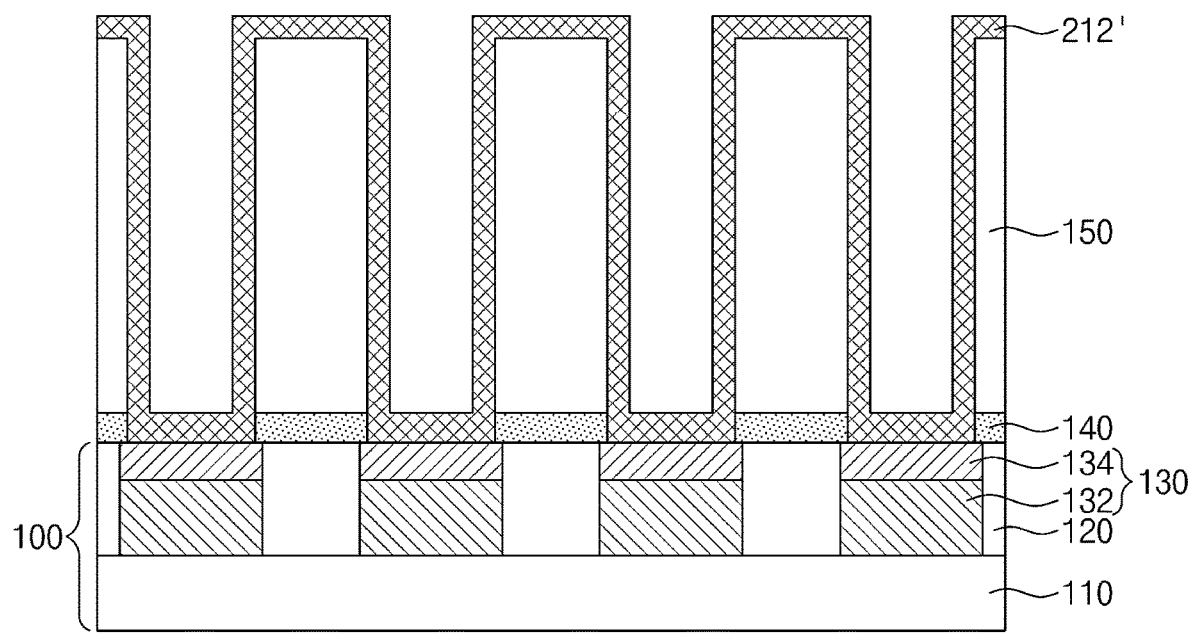

FIGS. 8 and 18 illustrate cross-sectional views showing a method of fabricating a semiconductor device according to some embodiments of the present inventive concepts. FIGS. 8 to 16 illustrate cross-sectional views showing a method of fabricating a semiconductor device according to some embodiments of the present inventive concepts. FIG. 17 illustrates an enlarged view showing section B of FIG. 16. FIG. 18 illustrates a cross-sectional view showing a method of fabricating a semiconductor device according to some embodiments of the present inventive concepts.

Referring to FIG. 8, a base layer 110 may be formed. For example, the base layer 110 may be formed by forming a semiconductor element on a semiconductor substrate and forming a dielectric layer that covers the semiconductor element.

A first conductive layer 131 may be formed on the base layer 110. The first conductive layer 131 may be formed by depositing a first metal on the base layer 110. For example, the first metal may include tungsten (W). Additionally (and/or alternatively), the first conductive layer 131 may include at least one selected from impurity-doped polysilicon, titanium nitride (TiN), and/or the like.

A second conductive layer 133 may be formed on the first conductive layer 131. The second conductive layer 133 may be formed by depositing a nitride of the second metal on the first conductive layer 131. The second metal may be different from the first metal. For example, the second metal may include titanium (Ti). The second conductive layer 133 may include titanium nitride (TiN).

Figure 9:
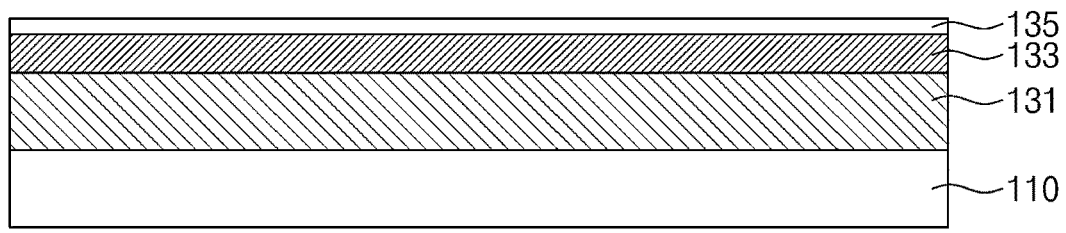

Referring to FIG. 9, a source layer 135 may be formed on the second conductive layer 133. The source layer 135 may include a compound of a dopant which is to be doped into the second conductive layer 133. The dopant may be a material with a valence electron number different from that of the second metal. For example, the dopant may include at least one of niobium (Nb), tantalum (Ta), vanadium (V). and/or the like. The source layer 135 may include, for example, niobium oxide ($nb_2O_5$).

Figure 10:
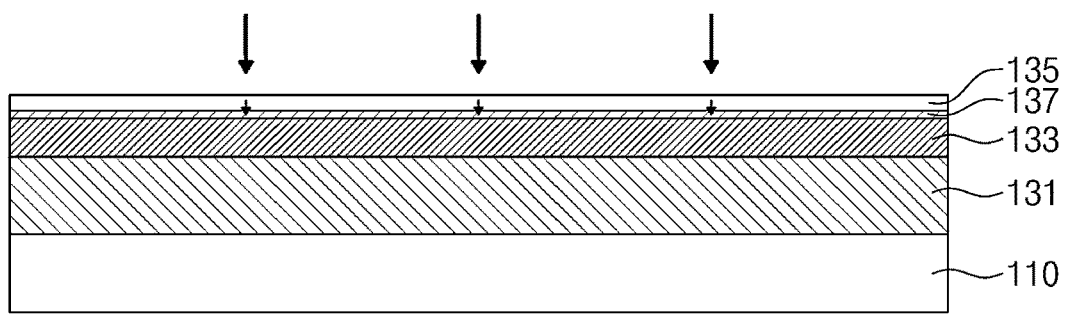

Referring to FIG. 10, an annealing process may be performed (e.g., on the source layer 135). The annealing process may drive a dopant material (e.g., niobium (Nb) element) to diffuse from the source layer 135 into the second conductive layer 133. The dopant material may diffuse into the second conductive layer 133 from an interface between the source layer 135 and the second conductive layer 133. As the dopant material diffuses into an upper portion of the second conductive layer 133, the upper portion of the second conductive layer 133 may be converted into a third conductive layer 137 and a lower portion of the second conductive layer 133 may remain. For example, the third conductive layer 137 may correspond to an interface layer formed by performing a surface treatment process on the second conductive layer 133. The third conductive layer 137 may include a nitride of the second metal implanted with the dopant.

Figure 11:
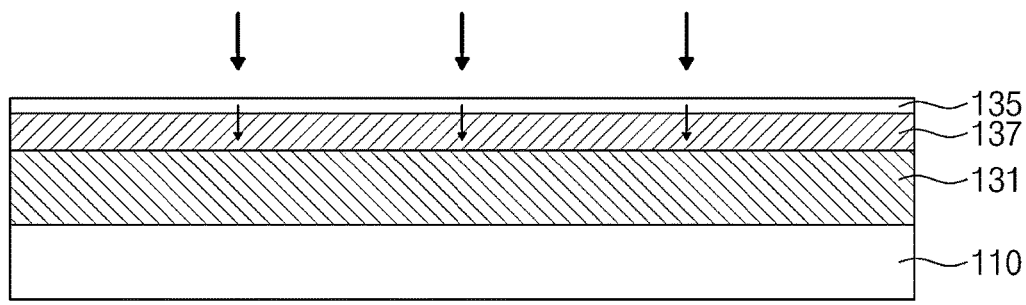

According to some embodiments, as illustrated in FIG. 11, the annealing process may continue until the dopant material diffuses into an entirety of the second conductive layer 133. For example, the entirety of the second conductive layer 133 may be converted into the third conductive layer 137, and/or the second conductive layer 133 may not remain after the annealing process. The following will describe the embodiment of FIG. 11, but like the embodiment of FIG. 10, only an upper portion of the second conductive layer 133 may be used to form the third conductive layer 137 so as to leave a lower portion of the second conductive layer 133 after the annealing process.

Afterwards, the source layer 135 may be removed. For example, a planarizing, washing, and/or etching processing may be used to remove the source layer 135.

Figure 12:
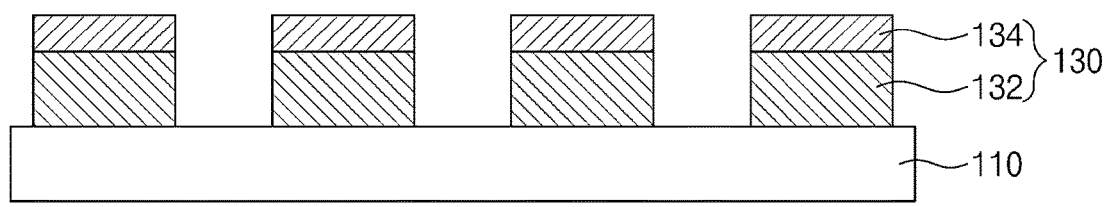

Referring to FIG. 12, the first and third conductive layers 131 and 137 may be patterned to form contact structures 130. For example, a mask pattern may be formed on the third conductive layer 137, and then the mask pattern may be used as an etching mask to sequentially etch the third conductive layer 137 and the first conductive layer 131. The third conductive layer 137 may be patterned to form upper conductive patterns 134, and the first conductive layer 131 may be patterned to form lower conductive patterns 132. When a lower portion of the second conductive layer 133 remains as shown in the embodiment of FIG. 10, the second conductive layer 133 may be patterned to form intermediate conductive patterns (see 136 of FIG. 4).

Figure 13:
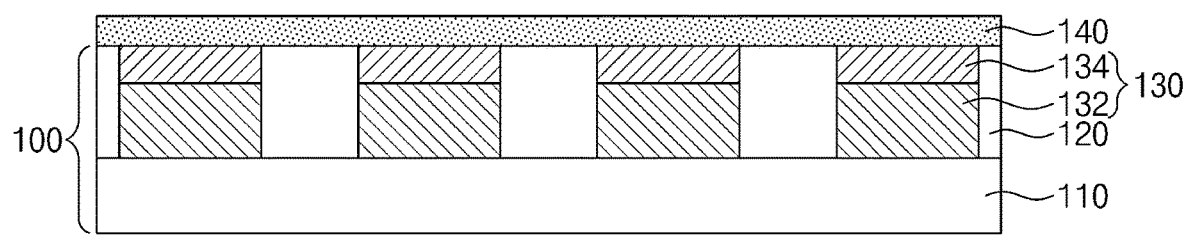

Referring to FIG. 13, an interlayer dielectric layer 120 may be formed on the base layer 110. The interlayer dielectric layer 120 may be formed by coating and/or depositing a dielectric material on the base layer 110. In some example embodiments, the coating and/or depositing of the dielectric material may include a polishing and/or planarizing the dielectric material. On the base layer 110, the interlayer dielectric layer 120 may surround the contact structures 130. A substrate 100 may be constituted by the base layer 110, the contact structures 130, and the interlayer dielectric layer 120.

An etch stop layer 140 may be formed on the interlayer dielectric layer 120 and the contact structures 130.

FIGS. 9 to 13 depict that the dopant diffuses into the second conductive layer 133 to form the third conductive layer 137 and that the third conductive layer 137 is patterned to form the contact structures 130, but the example embodiments are not limited thereto. According to some embodiments, on a resultant structure of FIG. 8, the first conductive layer 131 and the second conductive layer 133 may be patterned to form lower conductive patterns 132 and preliminary upper conductive pattern on the lower conductive patterns 132, an interlayer dielectric layer 120 may be formed on the base layer 110 to surround the lower conductive patterns 132 and the preliminary upper conductive patterns, a source layer 135 may be formed on the interlayer dielectric layer 120, the source layer 135 may undergo an annealing process to diffuse a dopant material into the upper conductive patterns to form upper conductive patterns 134, and then the source layer 135 may be removed to form contact structures 130. When the dopant material diffuses into only upper portions of the preliminary upper conductive patterns to form the upper conductive patterns 134, lower portions of remaining preliminary upper conductive patterns may constitute intermediate conductive patterns 136.

Figure 14:
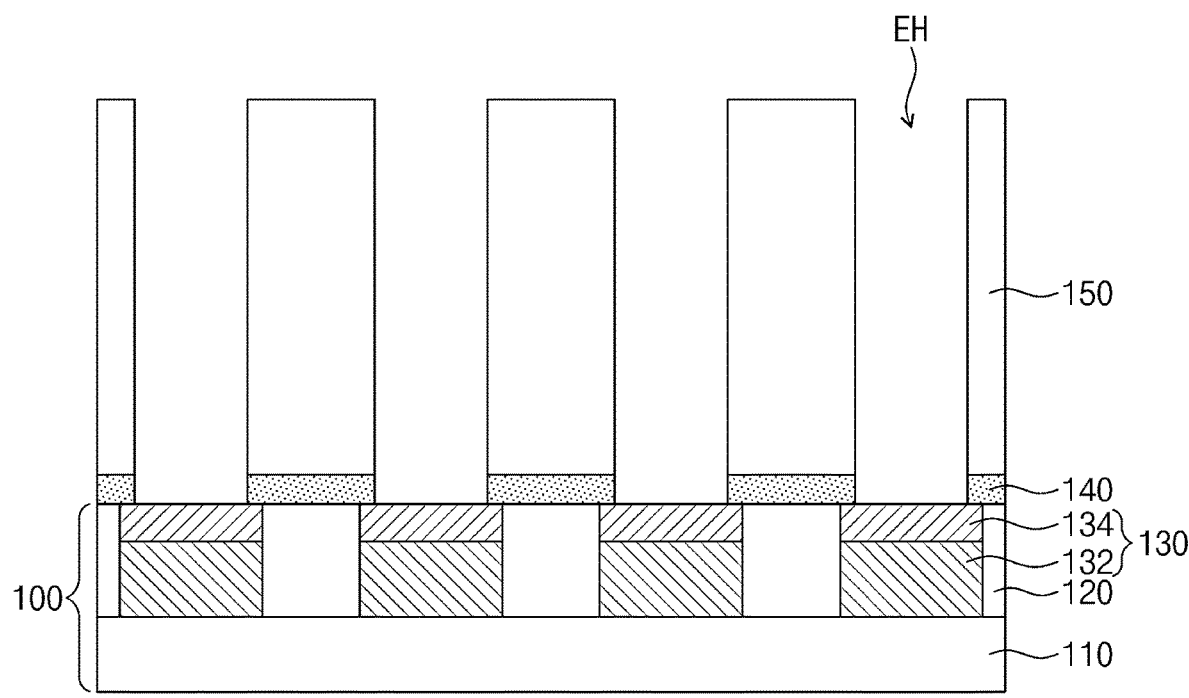

Referring to FIG. 14, a sacrificial layer 150 may be formed on the etch stop layer 140. The sacrificial layer 150 may be formed of, e.g., silicon oxide ($SiO_2$), silicon nitride (SiN), silicon boron nitride (SiBN), silicon carbon nitride (SiCN), and/or the like.

The sacrificial layer 150 and the etch stop layer 140 may be sequentially etched to form bottom-electrode holes EH that expose the contact structures 130. For example, a mask pattern may be formed on the sacrificial layer 150, and then the mask pattern may be used as an etching mask to perform an etching process. The bottom-electrode holes EH may expose top surfaces of the upper conductive patterns 134.

Figure 15:
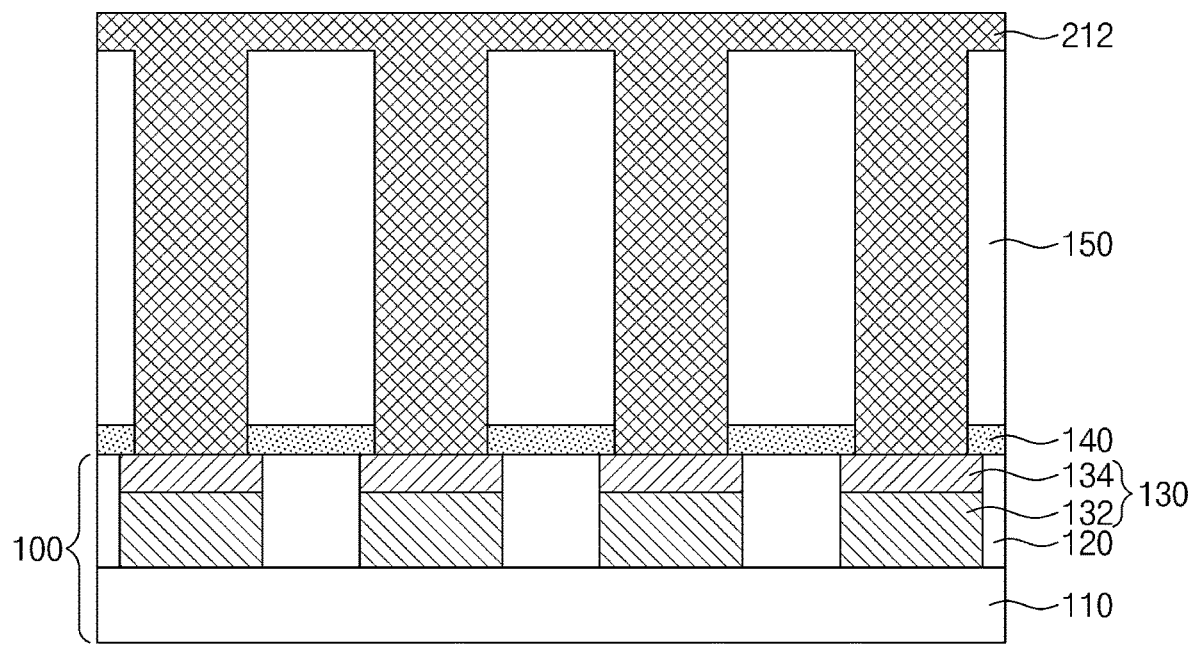

Referring to FIG. 15, bottom electrodes (see 210 of FIG. 1) may be formed in the bottom-electrode holes EH. For example, a material layer 212 may be stacked on an entire surface of the substrate 100. The material layer 212 may include an oxide conductive material. For example, the material layer 212 may include at least one of strontium ruthenate ($SrRuO_3$) and/or tin oxide ($SnO_2$) doped with tantalum (Ta).

Figure 16:
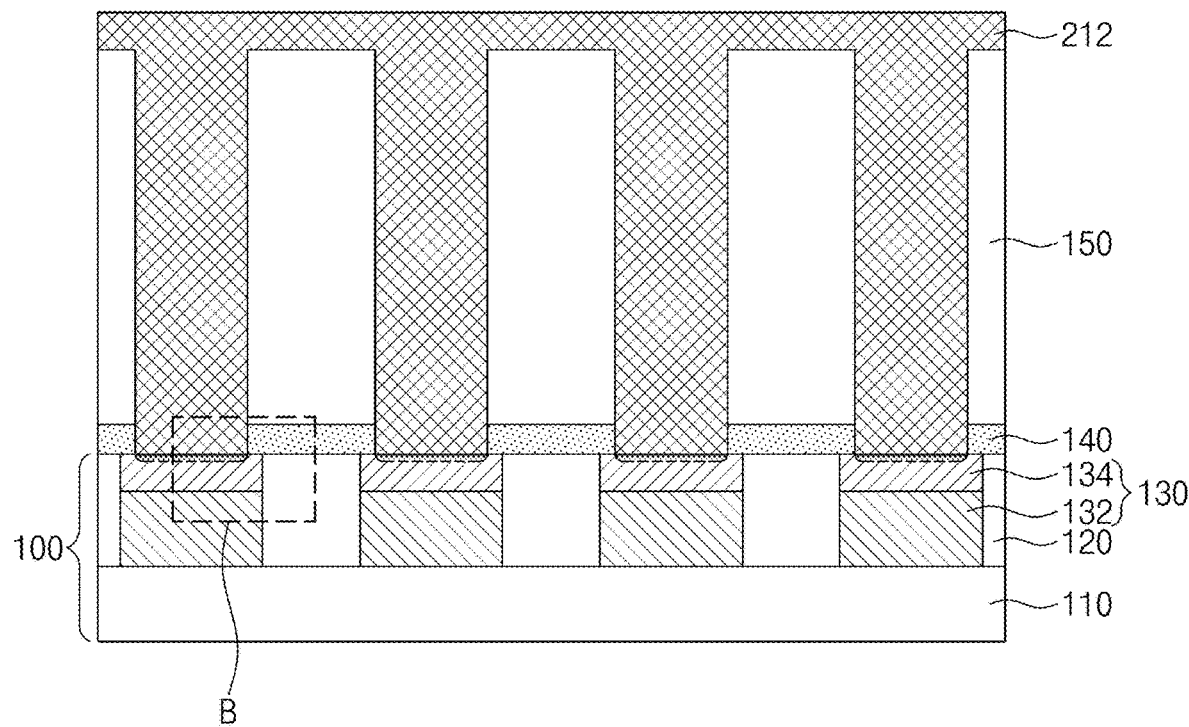

Referring to FIGS. 16 and 17, as the material layer 212 includes oxide, when bottom electrodes (see 210 of FIG. 1) are formed, oxygen may diffuse into the contact structures 130 from the material layer 212 (and/or the bottom electrodes 210 formed of the material layer 212). For example, the oxygen in the material layer 212 (and/or the bottom electrodes 210) may diffuse into the upper conductive patterns 134 of the contact structures 130. A concentration of the oxygen may decrease with increasing distance from an interface between the material layer 212 and the upper conductive patterns 134 (e.g., from the top surfaces of the upper conductive patterns 134).

According to some embodiments of the present inventive concepts, the upper conductive pattern 134 may be implanted with dopants and may increase in quantity of electric charge. Therefore, it may be possible to alleviate a reduction in resistance of the upper conductive pattern 134 due to the oxygen diffusion occurring when the bottom electrodes 210 are formed. In addition, the upper conductive pattern 134 may inhibit and/or prevent oxygen from diffusing into the lower conductive pattern 132 formed of only the first metal, and may protect and/or prevent the lower conductive pattern 132 from an electrical short and a resistance increase due to formation of an oxide of the first metal.

Referring back to FIG. 1, the material layer 212 may undergo an etch-back process to form bottom electrodes 210 in corresponding bottom-electrode holes EH. In the etch-back process, the material layer 212 may be partially removed from a top surface of the sacrificial layer 150, and the top surface of the sacrificial layer 150 may be exposed. In the etch-back process, the material layer 212 may be divided from each other to form the bottom electrodes 210, which are shaped like pillars, in corresponding bottom-electrode holes CH. The sacrificial layer 150 may be, subsequently removed, and the dielectric layer 220 and the upper electrode 230 may be formed in the gap between bottom electrodes 210.

For example, a dielectric layer 220 may be formed on the entire surface of the substrate 100. The dielectric layer 220 may be formed to have a uniform thickness on a top surface of the etch stop layer 140 and exposed surfaces of the bottom electrodes 210.

A top electrode 230 may be formed on the dielectric layer 220. For example, the top electrode 230 may be formed by depositing or coating a conductive material on the entire surface of the substrate 100.

According to some embodiments, as illustrated in FIG. 18, a material layer 212' may be deposited on a resultant structure of FIG. 14. The material layer 212' may conformally cover inner lateral surfaces and bottom surfaces of the bottom-electrode holes EH. Afterwards, a dielectric layer may be formed to fill the bottom-electrode holes EH and to cover the material layer 212', and then a planarization process may be performed on the dielectric layer. The planarization process may continue until a top surface of the sacrificial layer 150 is exposed. The planarization process may divide the material layer 212' into bottom electrodes (see 210' of FIG. 7) in corresponding bottom-electrode holes EH, which bottom electrodes 210 are shaped like hollow cups or cylinders. Thereafter, the dielectric layer and the sacrificial layer 150 may be removed. In this case, bottom electrodes 210' may be formed as illustrated in FIG. 7.

Figure 19:
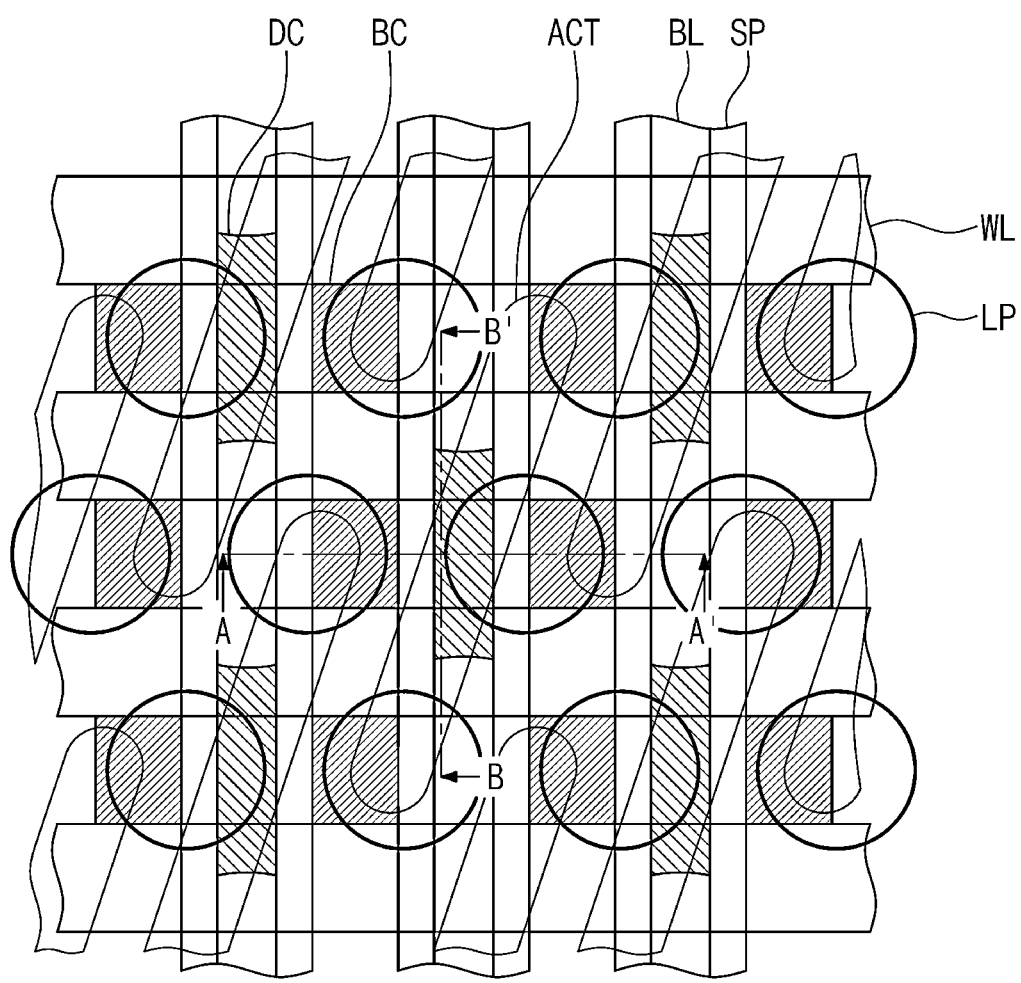
FIG. 19 illustrates a plan view showing a semiconductor device according to some embodiments of the present inventive concepts.
Figure 20:
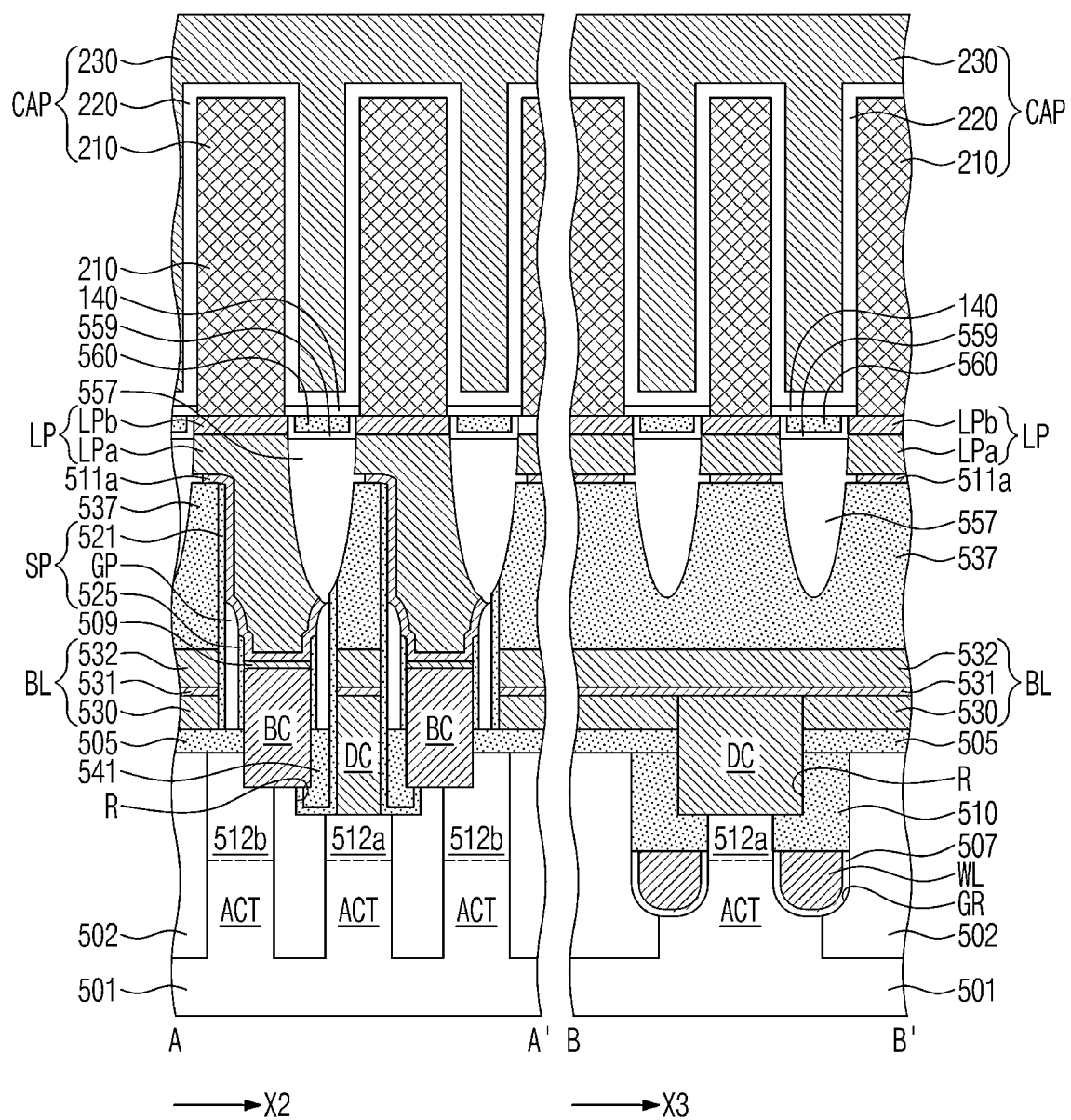
FIGS. 20 and 21 illustrate cross-sectional views showing a semiconductor device according to some embodiments of the present inventive concepts.

FIG. 19 illustrates a plan view showing a semiconductor device according to some embodiments of the present inventive concepts. FIG. 20 illustrates a cross-sectional view taken along lines A-A' and B-B' of FIG. 19, showing a semiconductor device according to some embodiments of the present inventive concepts.

Referring to FIGS. 19 and 20, a substrate 501 may be provided therein device isolation patterns 502 that define active regions ACT. Each of the active regions ACT may have an isolated shape. The active regions ACT may each have a bar shape that extends in a first direction X1 when viewed in a plan view. When viewed in a plan view, the active regions ACT may correspond to portions of the substrate 501 that are surrounded by the device isolation patterns 502. The substrate 501 may include a semiconductor material. The active regions ACT may be arranged in parallel to each other such that one of the active regions ACT may have an end portion adjacent to a center of a neighboring one of the active regions ACT.

Word lines WL may run across the active regions ACT. The word lines WL may be disposed in grooves GR formed in the device isolation patterns 502 and the active regions ACT. The word lines WL may be parallel to a second direction X2 that intersects the first direction X1. The word lines WL may be formed of a conductive material. A gate dielectric layer 507 may be disposed between each of the word lines WL and an inner surface of each groove GR. Although not shown, the grooves GR may have their bottom surfaces located relatively deeper in the device isolation patterns 502 and relatively shallower in the active regions ACT. The gate dielectric layer 507 may include at least one of a thermal oxide, silicon nitride (SiN), silicon oxynitride (SiON), high-k dielectric and/or the like. Each of the word lines WL may have a curved bottom surface.

A first impurity region 512a may be disposed in the active region ACT between a pair of the word lines WL, and a pair of second impurity regions 512b may be disposed in opposite edge portions of the active region ACT. The first and second impurity regions 512a and 512b may be doped with, for example, n-type impurities. The first impurity region 512a may correspond to a common drain region, and the second impurity regions 512b may correspond to source regions. A transistor may be constituted by one of the word lines WL and adjacent first and second impurity regions 512a and 512b. As the word lines WL are disposed in the grooves GR, each of the word lines WL may have thereunder a channel region whose channel length becomes increased within a limited planar area. Accordingly, a short-channel effect may be minimized.

The word lines WL may have their top surfaces lower than those of the active regions ACT. A word-line capping pattern 510 may be disposed on each of the word lines WL. The word-line capping patterns 510 may have their linear shapes that extend along longitudinal directions of the word lines WL, and may cover entire top surfaces of the word lines WL. The grooves GR may have inner spaces not occupied by the word lines WL, and the word-line capping patterns 510 may fill the unoccupied inner spaces of the grooves GR. The word-line capping pattern 510 may be formed of, for example, a silicon nitride (SiN) layer.

An interlayer dielectric pattern 505 may be disposed on the substrate 501. The interlayer dielectric pattern 505 may include at least one of a silicon oxide (SiO) layer, a silicon nitride (SiN) layer, a silicon oxynitride (SiON) layer, a multiple layer thereof, and/or the like. The interlayer dielectric pattern 505 may be formed to have island shapes that are spaced apart from each other when viewed in a plan view. The interlayer dielectric pattern 505 may be formed to simultaneously cover end portions of two adjacent active regions ACT.

The substrate 501, the device isolation pattern 502, and an upper portion of the word-line capping pattern 510 may be partially recessed to form a recess region R. The recess region R may constitute a mesh shape when viewed in a plan view. The recess region R may have a sidewall aligned with that of the interlayer dielectric pattern 505.

Bit lines BL may be disposed on the interlayer dielectric pattern 505. The bit lines BL may run across the word-line capping patterns 510 and the word lines WL. As disclosed in FIG. 19, the bit lines BL may be in parallel to a third direction X3 that intersects the first and second directions X1 and X2. The bit lines BL may each include a bit-line polysilicon pattern 530, a bit-line ohmic pattern 531, and a bit-line metal-containing pattern 532 that are sequentially stacked. The bit-line polysilicon pattern 530 may include impurity-doped polysilicon or impurity-undoped polysilicon. The bit-line ohmic pattern 531 may include a metal silicide layer. The bit-line metal-containing pattern 532 may include at least one selected from metal (e.g., tungsten (W), titanium (Ti), tantalum (Ta), and/or the like) and conductive metal nitride (e.g., titanium nitride (TiN), tantalum nitride (TaN), tungsten nitride (WN), and/or the like). A bit-line capping pattern 537 may be disposed on each of the bit lines BL. The bit-line capping patterns 537 may be formed of a dielectric material, such as a silicon nitride (SiN).

Bit-line contacts DC may be disposed in the recess region R that intersects the bit lines BL. The bit-line contacts DC may include impurity-doped polysilicon or impurity-undoped polysilicon. When viewed in a cross-section view taken along line B-B' as shown in FIG. 20, a sidewall of the bit-line contact DC may be in contact with that of the interlayer dielectric pattern 505. When viewed in the plan view as shown in FIG. 19, the bit-line contact DC may have a concave lateral surface in contact with the interlayer dielectric pattern 505. The bit-line contact DC may electrically connect the first impurity region 512a to the bit line BL.

A lower buried dielectric pattern 541 may be disposed in an unoccupied portion of the recess region R in which the bit-line contact DC is disposed. The lower buried dielectric pattern 541 may be formed of a dielectric such as a silicon oxide (SiO) layer, a silicon nitride (SiN) layer, a silicon oxynitride (SiON) layer, a multiple layer thereof, and/or the like.

Storage node contacts BC may be disposed between a pair of neighboring bit lines BL. The storage node contacts BC may be spaced apart from each other. The storage node contacts BC may include impurity-doped poly silicon or impurity-undoped polysilicon. The storage node contacts BC may have their concave top surfaces. In some example embodiments, a dielectric fence (not shown) may be disposed between the storage node contacts BC and between the bit lines BL.

A bit-line spacer SP may be interposed between the bit line BL and the storage node contact BC. The bit-line spacer SP may include a first spacer 521 and a second spacer 525 that are spaced apart from each other across a gap region GP. The gap region GP may be called an air gap. The first spacer 521 may cover a sidewall of the bit line BL and a sidewall of the bit-line capping pattern 537. The second spacer 525 may be adjacent to the storage node contact BC. The first spacer 521 and the second spacer 525 may include the same material. For example, the first spacer 521 and the second spacer 525 may include a silicon nitride (SiN) layer.

In some example embodiments, the second spacer 525 may have a bottom surface level with and/or lower than that of the first spacer 521. The second spacer 525 may have a top end whose level is lower than that of a top end of the first spacer 521. Such a configuration may increase a formation margin for landing pads LP which will be discussed below. As a result, the landing pad LP and the storage node contact BC may be prevented from being disconnected to each other. The first spacer 521 may extend to cover a sidewall of the bit-line contact DC and a sidewall and a bottom surface of the recess region R. For example, the first spacer 521 may be interposed between the bit-line contact DC and the lower buried dielectric pattern 541, between the word-line capping pattern 510 and the lower buried dielectric pattern 541, between the substrate 501 and the lower buried dielectric pattern 541, and between the device isolation pattern 502 and the lower buried dielectric pattern 541.

A storage node ohmic layer 509 may be disposed on the storage node contact BC. The storage node ohmic layer 509 may include, e.g., metal silicide. The storage node ohmic layer 509, the first and second spacers 521 and 525, and the bit-line capping pattern 537 may be conformally covered with a diffusion stop pattern 511a whose thickness is uniform. The diffusion stop pattern 511a may include metal nitride. For example, the diffusion stop pattern 511a may include at least one of a titanium nitride (TiN) layer and/or a tantalum nitride (TaN) layer.

A landing pad LP may be disposed on the diffusion stop pattern 511a. The landing pad LP may have an upper portion that covers a top surface of the bit-line capping pattern 537 and has a width greater than that of the storage node contact BC. A center of the landing pad LP may shift in the second direction X2 away from a center of the storage node contact BC. A portion of the bit line BL may vertically overlap the landing pad LP. The bit-line capping pattern 537 may have an upper sidewall that overlaps the landing pad LP.

The landing pads LP may correspond to the contact structures 130 of FIG. 1. For example, the landing pads LP may each have a lower conductive pattern LPa (which corresponds to 132 of FIGS. 1 and 2) and an upper conductive pattern LPb (which corresponds to 134 of FIGS. 1 and 2).

The lower conductive pattern LPa may be a lower portion of the landing pad LP. The lower conductive pattern LPa may be connected to the bit line BL. The lower conductive pattern LPa may include a first metal, such as tungsten (W).

The upper conductive pattern LPb may be disposed on the lower conductive pattern LPa. The upper conductive pattern LPb may be an upper portion of the landing pad LP. For example, the upper conductive pattern LPb may be located at a higher level than that of the diffusion stop pattern 511a. The upper conductive pattern LPb may have a flat plate shape. The upper conductive pattern LPb may be in contact with the lower conductive pattern LPa. The upper conductive pattern LPb may be in contact with one bottom electrode 210. The upper conductive pattern LPb may separate the bottom electrode 210 form the lower conductive pattern LPa. The upper conductive pattern LPb may have a thickness of greater than about 10 Å.

The upper conductive pattern LPb may include a nitride of a second metal. The second metal may be different from the first metal. For example, the second metal may include titanium (Ti). The upper conductive pattern LPb may include titanium nitride (TiN). The upper conductive pattern LPb may further contain a dopant. For example, the upper conductive pattern LPb may be formed of a nitride of the second metal implanted with the dopant. The dopant may be a material with a valence electron number different from the second metal. For example, the dopant may include at least one of niobium (Nb), tantalum (Ta), and/or vanadium (V).

According to some embodiments, the upper conductive pattern LPb may further contain oxygen (O). The oxygen may be, for example, a diffusion from the upper conductive pattern LPb from the bottom electrode 210 formed of an oxide electrode. Therefore, an oxygen concentration may decrease with increasing distance from an interface between the upper conductive pattern LPb and the bottom electrode 210. The oxygen may diffuse to a depth (dd, e.g., of FIGS. 5, 6, and 17) from the bottom electrode 210 into the upper conductive pattern LPb, and the depth dd may be less than a thickness of the upper conductive pattern LPb. Therefore, the oxygen may not diffuse into the lower conductive pattern LPa. For example, the upper conductive pattern LPb may be an interface layer for blocking oxygen diffusion from the bottom electrode 210 into the lower conductive pattern LPb and preventing a reduction in electrical resistance.

According to some embodiments of the present inventive concepts, the upper conductive pattern LPb may be implanted with a dopant with a valence electron number different from the second metal included in the upper conductive pattern LPb, and thus the upper conductive pattern LPb may increase in quantity of electric charge. Therefore, it may be possible to increase electrical conductivity of the upper conductive pattern LPb and/or to alleviate a reduction in resistance of the upper conductive pattern LPb due to the oxygen diffusion. Accordingly, a semiconductor device may improve in electrical properties.

Figure 21:
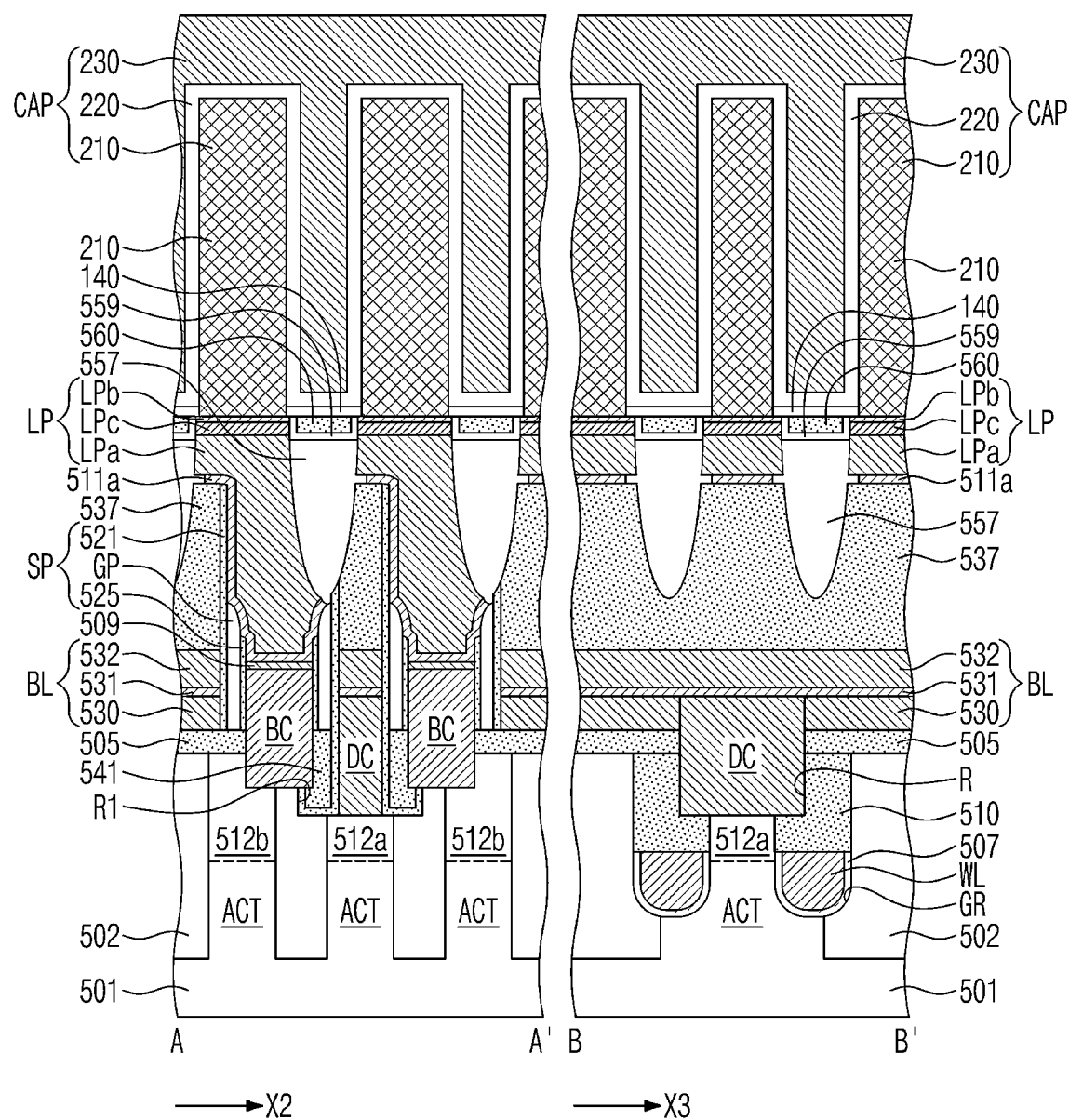

According to some embodiments, as shown in FIG. 21, an intermediate conductive pattern LPc (which corresponds to 136 of FIGS. 5 and 6) may be provided between the lower conductive pattern LPa and the upper conductive pattern LPb. The intermediate conductive pattern LPc may have a flat plate shape. The intermediate conductive pattern LPc may be in contact with the lower conductive pattern LPa. The intermediate conductive pattern LPc may be in contact with the upper conductive pattern LPb. The intermediate conductive pattern LPc may separate the upper conductive pattern LPb from the lower conductive pattern LPa. The upper conductive pattern LPb may have a thickness of greater than about 30 Å.

The intermediate conductive pattern LPc may be formed of a material similar to that of the upper conductive pattern LPb. For example, the intermediate conductive pattern LPc may include a nitride of the second metal. The second metal may be different from the first metal. For example, the second metal may include titanium (Ti). The intermediate conductive pattern LPc may include titanium nitride (TiN). The intermediate conductive pattern LPc may not contain a dopant. The intermediate conductive pattern LPc may be formed of a nitride of the second metal that is not implanted with the dopant. For example, the intermediate conductive pattern LPc may be formed of a nitride of the second metal, and the upper conductive pattern LPb may correspond to an interface layer formed by implanting the dopant into an upper portion of the intermediate conductive pattern LPc.

The intermediate conductive pattern LPc may not contain oxygen (O). The oxygen may be a material that diffuses into the upper conductive pattern LPb from the bottom electrode 210 formed of an oxide electrode. The oxygen may be blocked by the upper conductive pattern LPb and may not diffuse into the intermediate conductive pattern LPc.

A pad separation pattern 557 may be interposed between the landing pads LP. The pad separation pattern 557 may correspond to the interlayer dielectric layer 120 of FIG. 1. The pad separation pattern 557 may include, e.g., a silicon nitride (SiN) layer, a silicon oxide (SiO) layer, a silicon oxynitride (SiON) layer, a multiple layer thereof, and/or the like. The pad separation pattern 557 may define a top end of the gap region GP.

On the pad separation pattern 557, a first capping pattern 559 may be provided between neighboring landing pads LP. The first capping pattern 559 may be shaped like a liner and/or may be filled with a second capping pattern 560. The first and second capping patterns 559 and 560 may independently include a dielectric material such as, a silicon nitride (SiN) layer, a silicon oxide (SiO) layer, a silicon oxynitride (SiON) layer, a multiple layer thereof, and/or the like. The first capping pattern 559 may have porosity greater than that of the second capping pattern 560.

Bottom electrodes 210 may be disposed on corresponding landing pads LP. The bottom electrode 210 may correspond to the bottom electrodes 210 discussed with reference to FIGS. 1 to 7. The bottom electrode 210 may be, for example, a columnar electrode or a cylindrical electrode. The bottom electrodes 210 may include oxide electrodes. For example, the bottom electrodes 210 may include at least one of strontium ruthenate ($SrRuO_3$) and/or tin oxide ($SnO_2$) doped with tantalum (Ta). Alternatively, the bottom electrodes 210 may include metal, metal oxide, and/or doped polysilicon.

The bottom electrodes 210 may be provided therebetween with an etch stop layer 140 that covers a top surface of the pad separation pattern 557 and top surfaces of the first and second capping patterns 559 and 560. The etch stop layer 140 may include a dielectric material layer, such as at least one of a silicon nitride (SiN) layer, a silicon oxide (SiO) layer, a silicon oxynitride (SiON) layer, and/or the like. A dielectric layer 220 may cover surfaces of the bottom electrodes 210. The dielectric layer 220 may be covered with a top electrode 230.

FIGS. 22 to 33 illustrate cross-sectional views showing a method of fabricating a semiconductor device according to some embodiments of the present inventive concepts.

Figure 22:
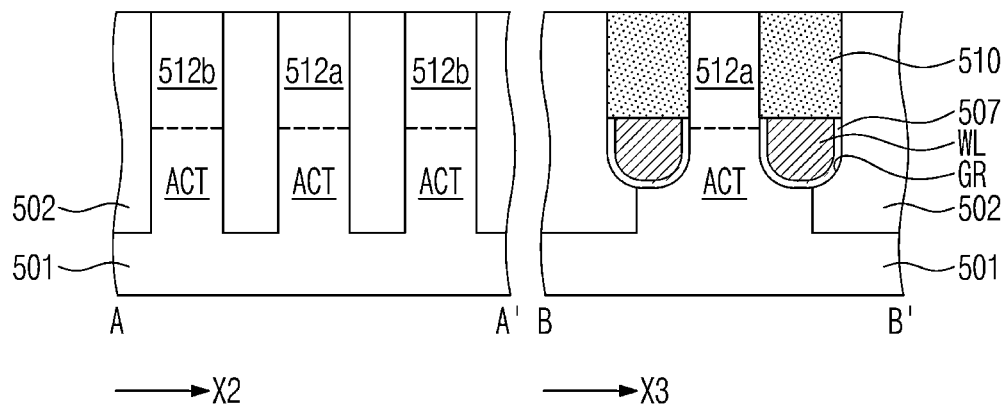
FIGS. 22 to 33 illustrate cross-sectional views showing a method of fabricating a semiconductor device according to some embodiments of the present inventive concepts.

Referring to FIG. 22, a device isolation pattern 502 may be formed in a substrate 501, defining active regions ACT. For example, a trench may be formed in the substrate 501, and the trench may be filled with a dielectric material to form the device isolation pattern 502. The active regions ACT and the device isolation pattern 502 may be etched to form grooves GR. Each of the grooves GR may have a curved bottom surface.

Word lines WL may be formed in corresponding grooves GR. A pair of word lines WL may run across the active regions ACT. Before the word lines WL are formed, a gate dielectric layer 507 may be formed on an inner surface of each of the grooves GR. The gate dielectric layer 507 may be formed by one or more of thermal oxidation, chemical vapor deposition (CVD), atomic layer deposition (ALD), and/or the like. A conductive layer may be stacked on the substrate 501, and an etch-back process and/or a chemical mechanical polishing (CMP) process may be performed to form the word lines WL in the grooves GR. The word lines WL may be recessed to have their top surfaces lower than those of the active regions ACT. For example, the grooves GR may be filled with a dielectric layer such as a silicon nitride layer formed on the substrate 501, and then the dielectric layer may be planarized to form word-line capping patterns 510 on corresponding word lines WL.

The word-line capping patterns 510 and the device isolation pattern 502 may be used as a mask to implant impurities into the active regions ACT. Therefore, first and second impurity regions 512a and 512b may be formed in the active regions ACT. The first and second impurity regions 512a and 512b may have their conductivity types different from that of the substrate 501. For example, when the substrate 501 has a neutral and/or p-type conductivity, each of the first and second impurity regions 512a and 512b may have an n-type conductivity.

Figure 23:
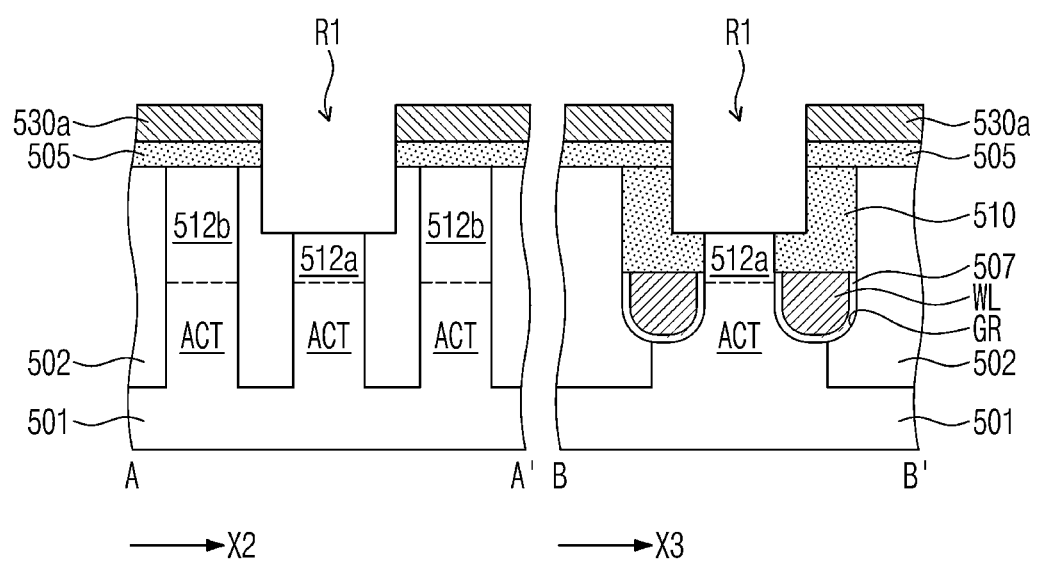

Referring to FIG. 23, an interlayer dielectric pattern 505 and a polysilicon mask pattern 530a may be formed on the substrate 501. For example, a dielectric layer and a first polysilicon layer may be sequentially formed on the substrate 501. The first polysilicon layer may be patterned to form the polysilicon mask pattern 530a. The polysilicon mask pattern 530a may be used as an etching mask to etch the dielectric layer, the device isolation pattern 502, the substrate 501, and the word-line capping patterns 510 to form a first recess region R1 and the interlayer dielectric pattern 505. The interlayer dielectric pattern 505 may have a plurality of island shapes that are spaced apart from each other. A plurality of first recess regions R1 may have a mesh shape when viewed in a plan view. The first recess regions R1 may expose the first impurity regions 512a.

Figure 24:
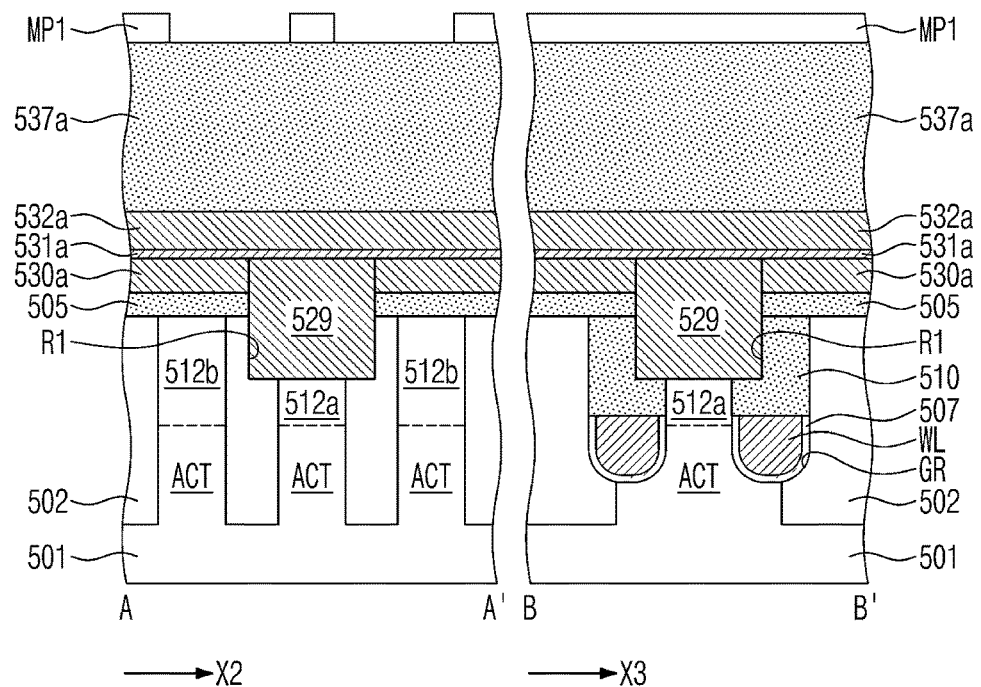

Referring to FIG. 24, a second polysilicon layer 529 may be formed on the substrate 501, filling the first recess region R1. Afterwards, the second polysilicon layer 529 may undergo a planarization process to partially remove the second polysilicon layer 529 positioned on the polysilicon mask pattern 530a. After the polarization process, the polysilicon mask pattern 530a may be exposed.

An ohmic layer 531a, a metal-containing layer 532a, and a capping layer 537a may be sequentially formed on the polysilicon mask pattern 530a and the second polysilicon layer 529. The ohmic layer 531a may be formed of metal silicide, such as cobalt silicide ($CoSi_2$). A metal layer may be deposited on the polysilicon mask pattern 530a and the second polysilicon layer 529, and then an annealing process may be performed to form the ohmic layer 531a. In the annealing process, the metal layer may react with polysilicon mask pattern 530a and the second polysilicon layer 529, thereby forming metal silicide. The metal layer may have a portion that does not react in the annealing process, and the non-reacted portion of the metal layer may be removed.

First mask patterns MP1 may be formed on the capping layer 537a. The first mask patterns MP1 may be an etching mask that is provided for limiting a planar shape of a bit line BL which will be discussed below. The first mask patterns MP1 may extend in a third direction X3.

Figure 25:
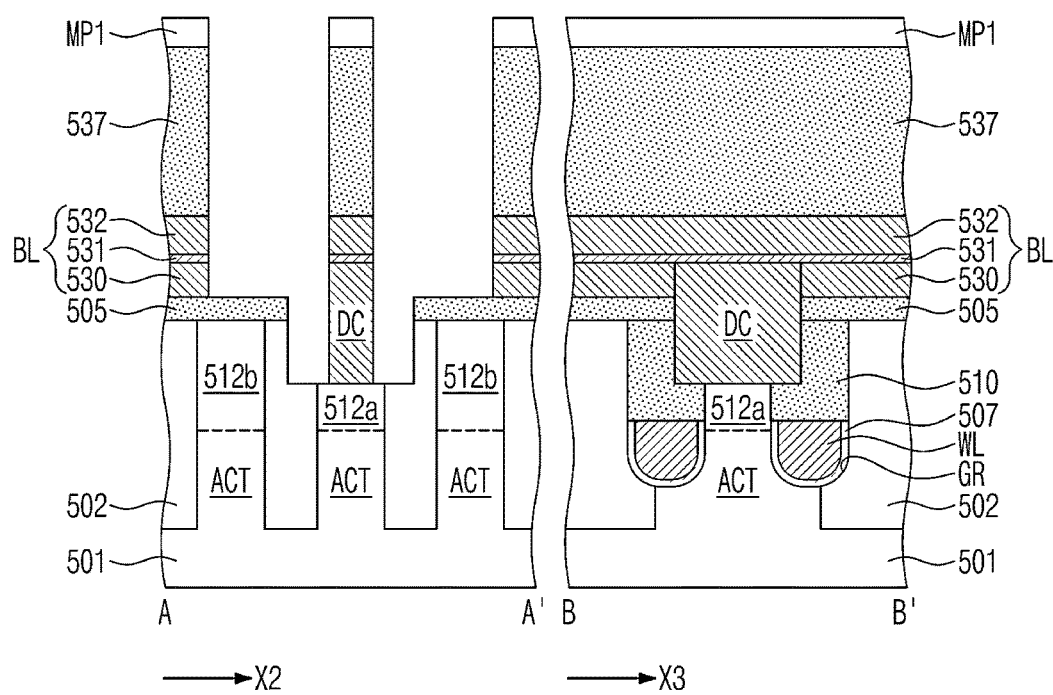

Referring to FIG. 25, an etching process may be performed in which the capping layer 537a, the metal-containing layer 532a, the ohmic layer 531a, the polysilicon mask pattern 530a, and the second polysilicon layer 529 are sequentially etched to form a bit-line capping pattern 537, a bit line BL, and a bit-line contact DC. The etching process may be executed by using the first mask patterns MP1 are used as an etching mask. The bit line BL may include a bit-line polysilicon pattern 530, a bit-line ohmic pattern 531, and a bit-line metal-containing pattern 532. The etching process may partially expose a top surface of the interlayer dielectric pattern 505, and may also partially expose an inner sidewall and a bottom surface of first recess region R1. The first mask patterns MP1 may be removed after the formation of the bit line BL and the bit-line contact DC.

Figure 26:
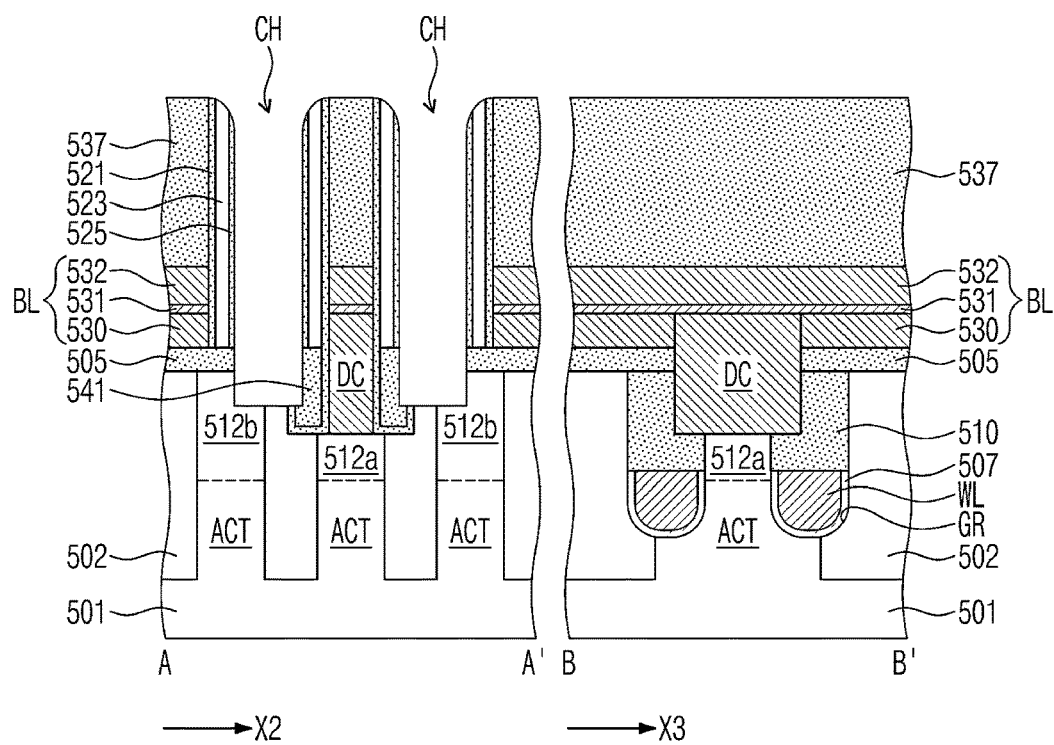

Referring to FIG. 26, a first spacer layer may be conformally formed on the substrate 501. The first spacer layer may conformally cover the bottom surface and the inner sidewall of the first recess region R1. The first spacer layer may be a silicon nitride (SiN) layer. Afterwards, a dielectric layer, such as a silicon nitride layer, may be stacked to fill the first recess region R1, and the dielectric layer may undergo an anisotropic etching process to allow a buried dielectric pattern 152 to remain in the first recess region R1. In this case, when the anisotropic etching process is performed, the first spacer layer may also be etched to form a first spacer 521.

A sacrificial spacer layer may be conformally formed on the substrate 501, and then an anisotropic etching process may be performed to form a sacrificial spacer 523 that covers a sidewall of the first spacer 521. The sacrificial spacer 523 may include a material having an etch selectivity with respect to the first spacer 521. For example, the sacrificial spacer 523 may be formed of a silicon oxide (SiO) layer.

A second spacer 525 may be formed to cover a sidewall of the sacrificial spacer 523. For example, a second spacer layer may be conformally formed on the substrate 501, and then an anisotropic etching process may be performed to form the second spacer 525. The second spacer 525 may be formed of a silicon nitride (SiN) layer.

The second impurity region 512b may be exposed. For example, after the formation of the second spacer 525, a contact hole CH may be formed by etching the interlayer dielectric pattern 505 between the bit lines BL. In this step, the second impurity region 512b and the device isolation pattern 502 may also be partially etched. After the formation of the second spacer 525, an etching process may be separately performed to etch the interlayer dielectric pattern 505. Alternatively, the interlayer dielectric pattern 505 may be etched in the anisotropic etching process for forming the second spacer 525.

In some embodiments, after the formation of the sacrificial spacer 523, the second impurity region 512b may be exposed. For example, after the formation of the sacrificial spacer 523, a contact hole CH may be formed by etching the interlayer dielectric pattern 505 between the bit lines BL. In this step, the second impurity region 512b and the device isolation pattern 502 may also be partially etched. Thereafter, the second spacer 525 may be formed. The second spacer 525 may cover a lateral surface of the interlayer dielectric pattern 505 exposed inside the contact hole CH. The following description will focus on the embodiment of FIG. 26.

Figure 27:
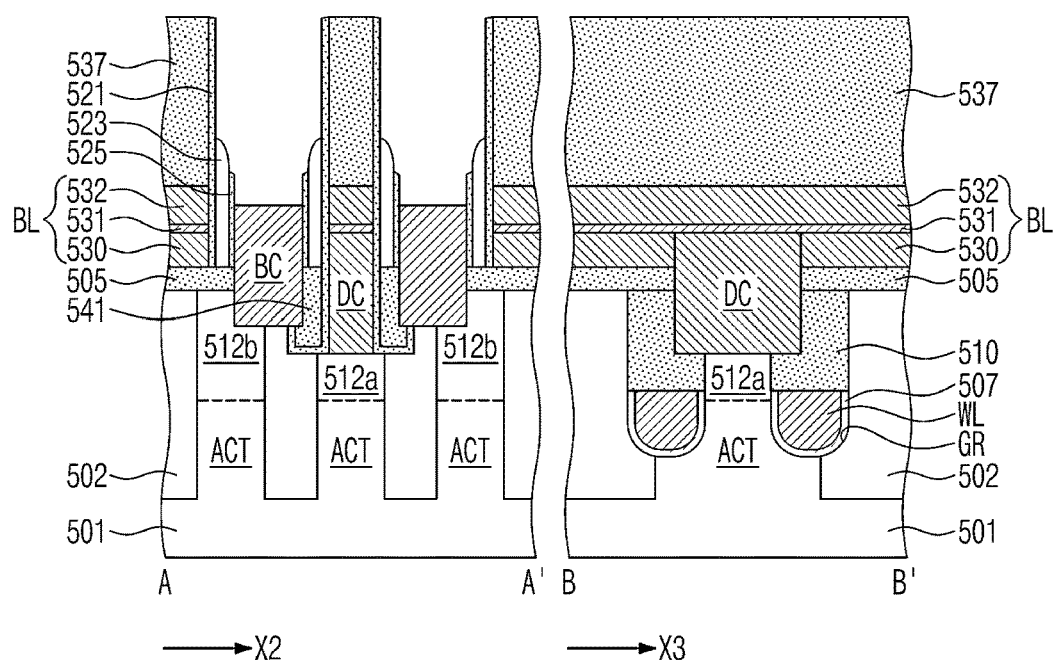

Referring to FIG. 27, a storage node contact BC may be formed in each of the contact holes CH. For example, a selective epitaxial growth process may be performed in which the second impurity region 512b exposed to the contact hole CH is used as a seed, such that the storage node contact BC may be grown from the second impurity region 512b. The storage node contact BC may include, e.g., single-crystalline silicon.

Thereafter, an etching process may be performed to remove the second spacer 525 and the sacrificial spacer 523 each of which lateral surfaces is not covered with the storage node contact BC and to expose an upper sidewall of the first spacer 521. Therefore, an upper portion of the first spacer 521 may be exposed. This process may increase a process margin for forming a landing pad LP which will be discussed below. When removing the upper portions of the sacrificial spacer 523 and the second spacer 525, the upper portion of the first spacer 521 may also be partially removed to cause the first spacer 521 to have a small width.

Figure 28:
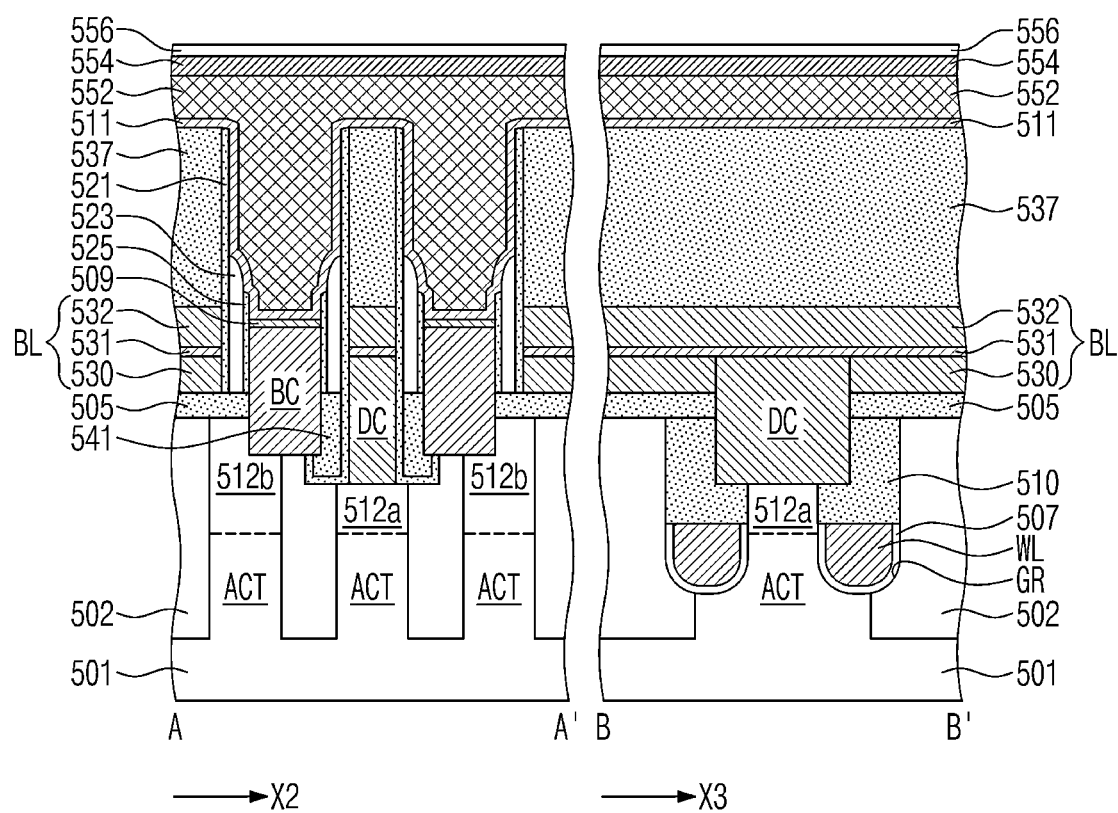

Referring to FIG. 28, a storage node ohmic layer 509 may be formed on the storage node contact BC, and a diffusion stop layer 511 may be conformally formed on the substrate 501. A first landing pad layer 552 may be formed on the substrate 501 to fill a space between the bit-line capping patterns 537. The first landing pad layer 552 may include the first metal. For example, the first landing pad layer 552 may include tungsten (W).

A second landing pad layer 554 may be formed on the first landing pad layer 552. The second landing pad layer 554 may be formed by depositing a nitride of the second metal on the first landing pad layer 552. The second metal may be different from the first metal. For example, the second metal may include titanium (Ti). The second landing pad layer 554 may include titanium nitride (TiN).

A source layer 556 may be formed on the second landing pad layer 554. The source layer 556 may include a compound of a dopant which is intended to be doped into the second landing pad layer 554. The dopant may be a material with a valence electron number different from the second metal. For example, the dopant may include niobium (Nb), tantalum (Ta), vanadium (V), and/or the like. For example, the source layer 556 may include niobium oxide ($nb_2O_5$).

Figure 29:
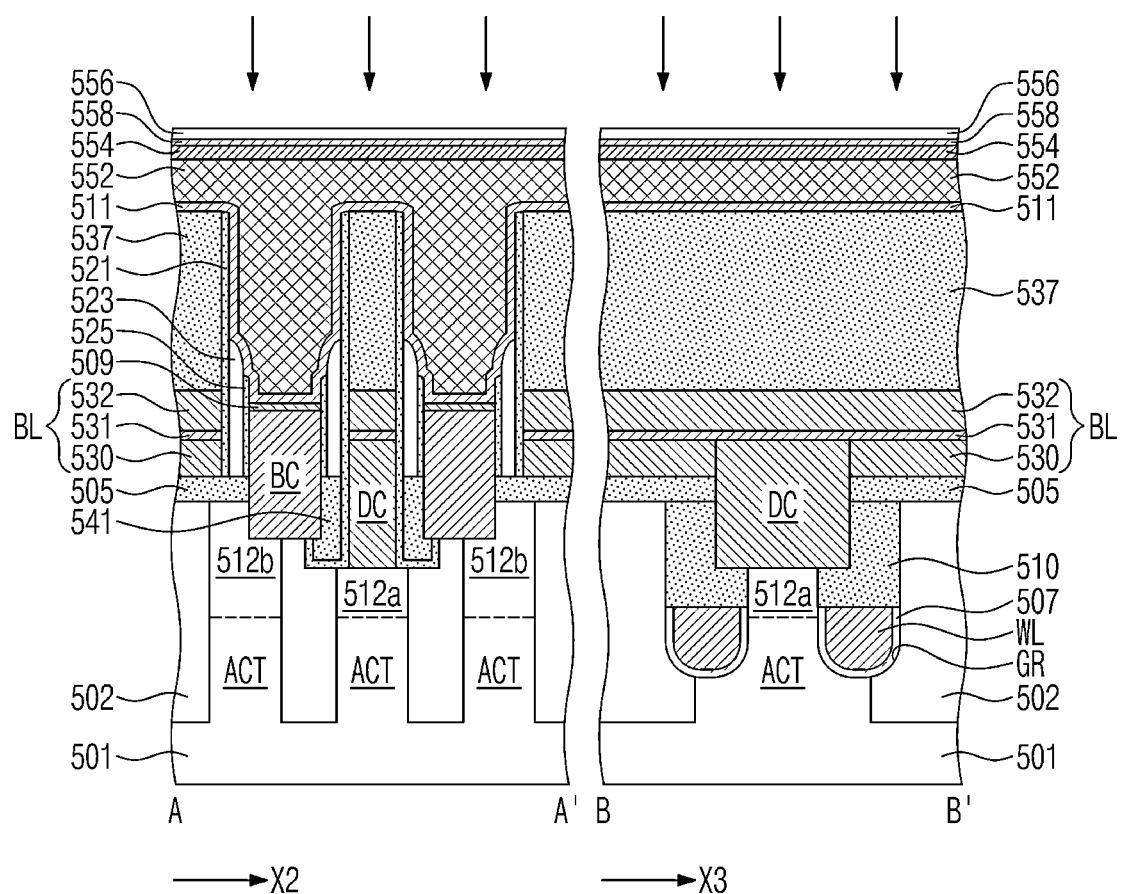

Referring to FIG. 29, an annealing process may be performed on the source layer 556. The annealing process may drive a dopant material (e.g., niobium (Nb) element) to diffuse from the source layer 556 into the second landing pad layer 554. The dopant material may diffuse into the second landing pad layer 554 from an interface between the source layer 556 and the second landing pad layer 554. As the dopant material diffuses into an upper portion of the second landing pad layer 554, the upper portion of the second landing pad layer 554 may be converted into a third landing pad layer 558 and a lower portion of the second landing pad layer 554 may remain. For example, the third landing pad layer 558 may correspond to an interface formed by performing a surface treatment process on a surface of the second landing pad layer 554. The third landing pad layer 558 may include a nitride of the second metal implanted with the dopant.

According to some embodiments, the annealing process may continue the dopant material diffuses into an entirety of the second landing pad layer 554. For example, the entirety of the second landing pad layer 554 may be converted into the third landing pad layer 558, and the second landing pad layer 554 may not remain after the annealing process. Alternatively, in some embodiments the dopant may partially diffuse into the second landing pad layer 554, and such that a portion of the second landing pad layer 554 remains undoped.

Afterwards, the source layer 556 may be removed.

Figure 30:
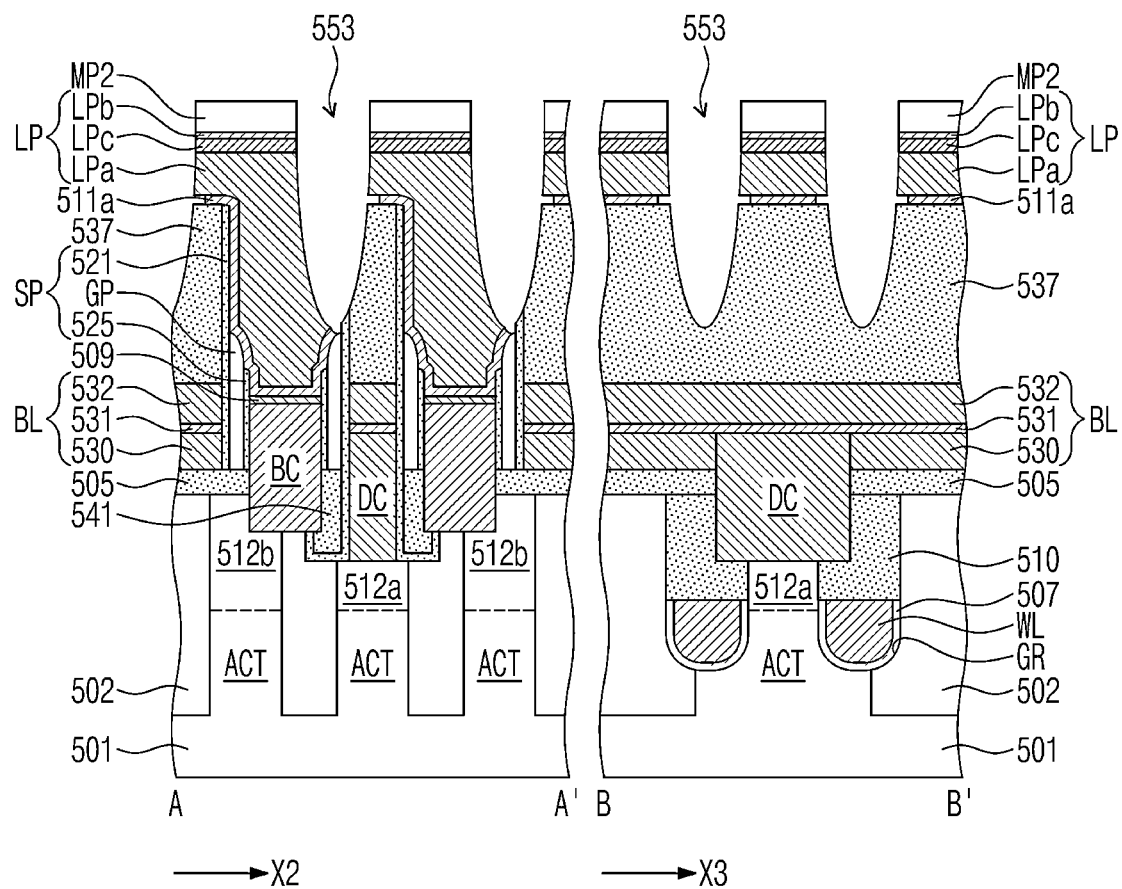

Referring to FIG. 30, second mask patterns MP2 may be formed on the third landing pad layer 558. The second mask patterns MP2 may be formed of, e.g., an amorphous carbon layer (ACL), but the example embodiments are not limited thereto. The second mask patterns MP2 may limit a position of a landing pad LP which will be discussed. The second mask patterns MP2 may be formed to vertically overlap the storage node contacts BC.

The second mask patterns MP2 may be used as an etching mask to perform an anisotropic etching process to partially remove the third landing pad layer 558, the second landing pad layer 554, and the first landing pad layer 552. Therefore, the third landing pad layer 558, the second landing pad layer 554, and the first landing pad layer 552 may be divided to form an upper conductive pattern LPb, an intermediate conductive pattern LPc, and a lower conductive pattern LPa, respectively, and a landing pad LP may be constituted by the upper conductive pattern LPb, the intermediate conductive pattern LPc, and the lower conductive pattern LPa. The etching process may form openings 553 that expose the diffusion stop layer 511.

An isotropic etching process may be performed to pattern the diffusion stop layer 511 exposed to the openings 553. The diffusion stop layer 511 may be patterned to form diffusion stop patterns 511a that are separated from each other. After the isotropic etching process, there may be exposed the first spacers 521 and portions of top surfaces of the bit-line capping patterns 537. Depending on the degree of progress of the isotropic etching process, the diffusion stop patterns 511a may be over-etched to partially expose bottom surfaces of the landing pads LP.

An isotropic etching process may be performed to partially remove the bit-line capping pattern 537 and the first spacer 521 that are exposed to the openings 553, thereby exposing the sacrificial spacers 523.

An isotropic etching process may be performed to remove the sacrificial spacer 523. The sacrificial spacer 523 may be removed to form a gap region GP between the first spacer 521 and the second spacer 525.

Afterwards, the second mask patterns MP2 may be removed.

Figure 31:
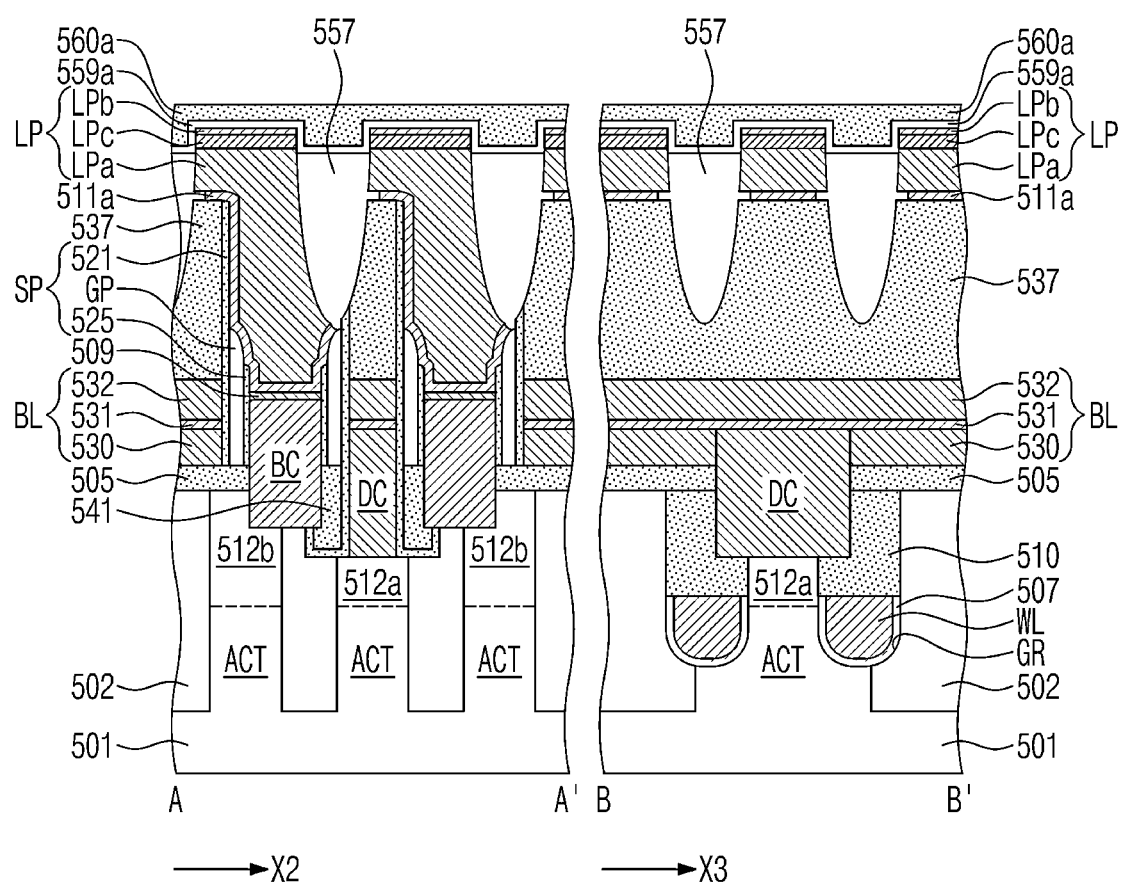

Referring to FIG. 31, a pad separation layer may be formed to fill the openings 553. The pad separation layer may also be formed on the landing pads LP. The pad separation layer may close an upper portion of the gap region GP.

An upper portion of the pad separation layer may be removed. For example, the pad separation layer may undergo an anisotropic etching process and/or an etch-back process. A portion of the pad separation layer may be removed to expose top surfaces and upper sidewalls of the landing pads LP and to form pad separation patterns 557 that are separated from each other.

Although not shown, a first capping layer 559a may be conformally formed on the pad separation patterns 557 and the landing pads LP. A second capping layer 560a may be formed on the first capping layer 559a. The second capping layer 560a may be formed of, for example, a silicon nitride (SiN) layer. On the pad separation patterns 557, the second capping layer 560a may fill an inside of the first capping layer 559a.

Figure 32:
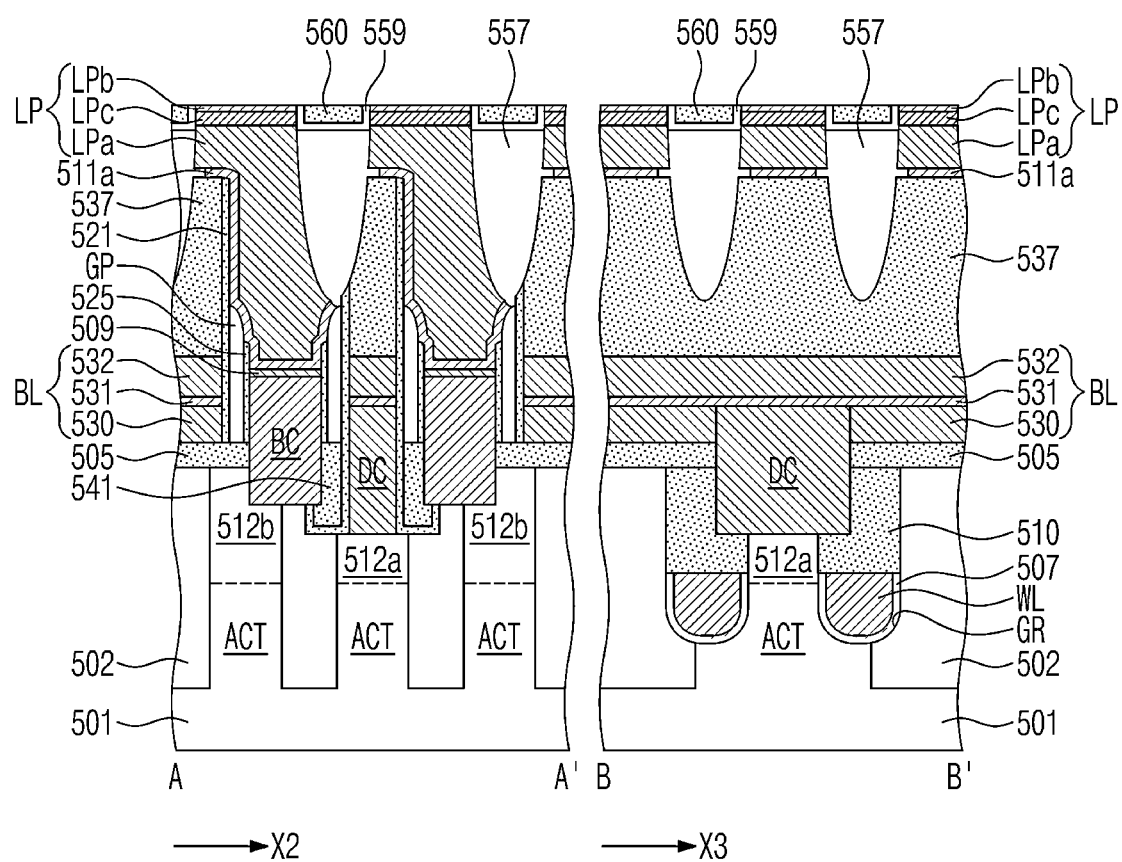

Referring to FIG. 32, an etch-back process and/or a chemical mechanical polishing (CMP) process may be performed to planarize the first capping layer 559a and the second capping layer 560a. The planarization process may form a first capping pattern 559 and a second capping pattern 560 that are limited between the landing pads LP. The planarization may remove the first capping layer 559a and the second capping layer 560a on the landing pads LP, and thus the landing pads LP may be exposed.

Figure 33:
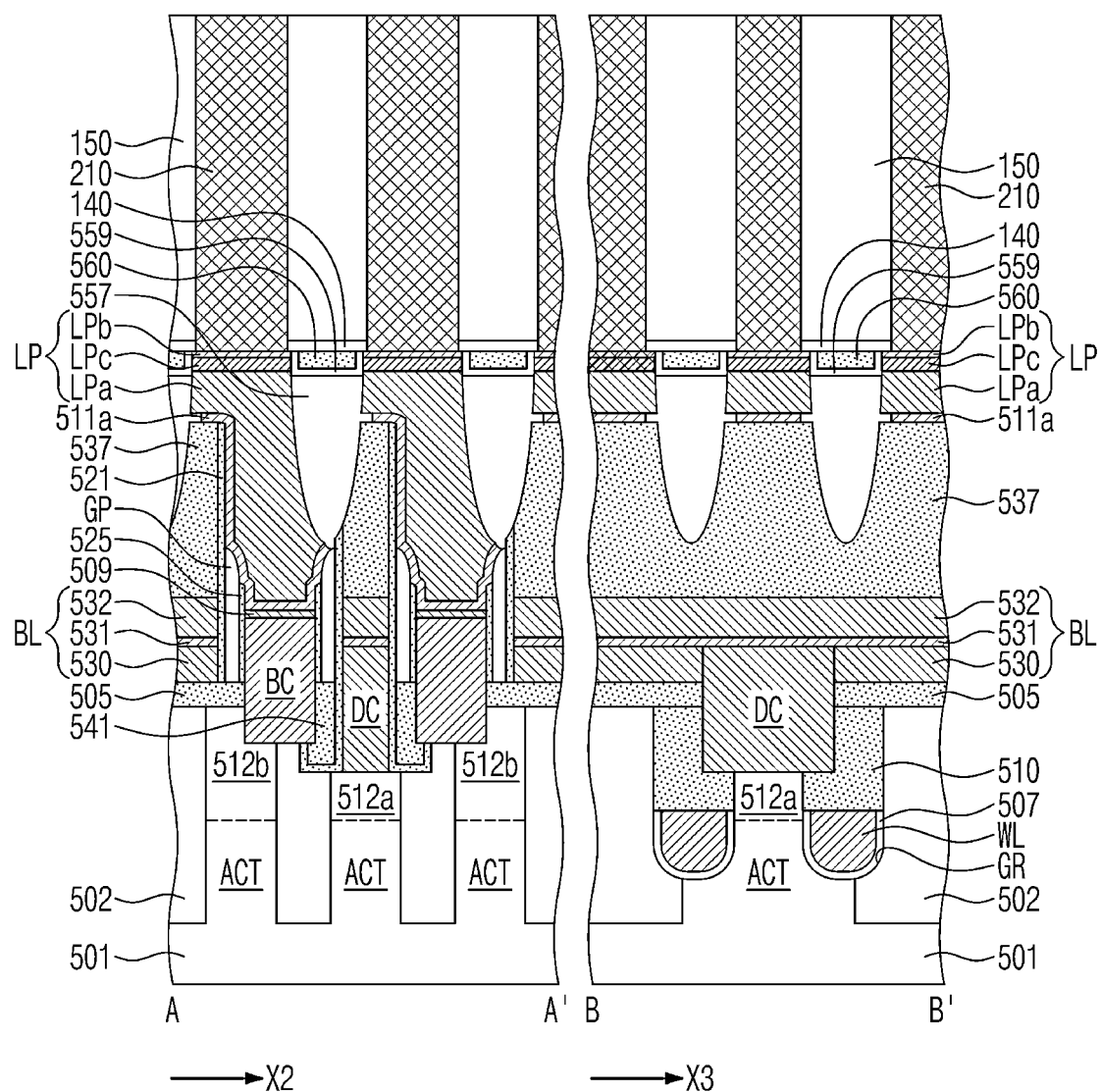

Referring to FIG. 33, bottom electrodes 210 may be formed on the landing pads LP. For example, an etch stop layer 140 may be formed on the landing pads LP, the first capping pattern 559, and the second capping pattern 560. A sacrificial layer 150 may be formed on the etch stop layer 140. The etch stop layer 140 may be formed of a silicon nitride (SiN) layer. The sacrificial layer 150 may be formed of a material having an etch selectivity with respect to the etch stop layer 140. For example, the sacrificial layer 150 may be formed of a silicon oxide (SiO) layer.

The sacrificial layer 150 and the etch stop layer 140 may be sequentially etched to form electrode holes that expose the landing pads LP. The conductive layer may be stacked to fill the electrode holes, and may undergo an etch-back process or a chemical mechanical polishing (CMP) process to remove the conductive layer on the sacrificial layer 150 to form the bottom electrode 210.

An isotropic etching process may be performed to remove the sacrificial layer 150 between the bottom electrodes 210 to expose a surface of each of the bottom electrode 210 and the etch stop layer 140.

Referring back to FIG. 21, a dielectric layer 220 may be formed on the substrate 501. The dielectric layer 220 may cover the bottom electrodes 210 and the etch stop layer 140. For example, the dielectric layer 220 may be formed by depositing zirconium oxide (e.g., $ZrO_x$) and/or hafnium oxide (e.g., $HfO_x$).

A top electrode 230 may be formed on the dielectric layer 220, forming the bottom electrodes 210. Therefore, a capacitor CAP may be constituted by the bottom electrode 210, the top electrode 230, and the dielectric layer 220 between the bottom and top electrodes 210 and 230.

A semiconductor device according to some embodiments of the present inventive concepts, an upper conductive pattern may increase in quantity of electric charge and electric conductivity. Accordingly, the semiconductor device may improve in electrical properties.

According to some embodiments of the present inventive concepts, as the upper conductive pattern increases in quantity of electric charge, it may be possible to alleviate a reduction in resistance of the upper conductive pattern due to oxygen diffusion from a bottom electrode including oxygen. In addition, as the upper conductive pattern contains oxygen that diffuses from the bottom electrode, it may be possible to prevent oxygen from diffusing into a lower conductive pattern formed of only a first metal. For example, it may be possible to prevent an increase in electrical short and resistance due to formation of an oxide of the first metal. Accordingly, the semiconductor device may increase in electrical properties and driving reliability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
a substrate;
a contact structure at least partially penetrating the substrate, the contact structure including a lower conductive pattern and an upper conductive pattern on the lower conductive pattern, the upper conductive pattern including a nitride of a first metal implanted with a dopant;
a bottom electrode on the substrate, the bottom electrode comprising a conductive oxide connected to the contact structure;
a top electrode on the bottom electrode; and
a dielectric layer separating the top electrode from the bottom electrode,
wherein the upper conductive pattern further contains a concentration of oxygen which decreases in a direction from a top surface of the upper conductive pattern toward an inside of the upper conductive pattern.

2. The semiconductor device of claim 1, wherein the dopant has a valence electron number different from a valence electron number of the first metal.

3. The semiconductor device of claim 2, wherein
the first metal includes titanium (Ti), and
the dopant includes at least one of niobium (Nb), tantalum (Ta), or vanadium (V).

4. The semiconductor device of claim 1, wherein a thickness of the upper conductive pattern is in a range of 10 Å to 30 Å.

5. The semiconductor device of claim 1, wherein
the lower conductive pattern includes a second metal, and
the first metal and the dopant include a material different from a material of the second metal.

6. The semiconductor device of claim 5, wherein the second metal includes tungsten (W).

7. The semiconductor device of claim 1, wherein
the bottom electrode is coupled to the top surface of the upper conductive pattern, and
the upper conductive pattern separates the bottom electrode from the lower conductive pattern.

8. The semiconductor device of claim 1, further comprising:
an intermediate conductive pattern between the upper conductive pattern and the lower conductive pattern,
wherein the intermediate conductive pattern includes the nitride of the first metal without the dopant.

9. The semiconductor device of claim 1, wherein
the bottom electrode has a hollow cup shape, and
the dielectric layer extends to contact an inner lateral surface of the bottom electrode.

10. The semiconductor device of claim 1, wherein the conductive oxide of the bottom electrode includes at least one of strontium ruthenate ($SrRuO_3$) or tin oxide ($SnO_2$) doped with tantalum (Ta).

11. The semiconductor device of claim 1, wherein the lower conductive pattern includes a metallic material,
wherein the metallic material is a conductor and an oxide of the metallic material has a conductivity less than a conductivity of the metallic material.

12. A semiconductor device, comprising:
a device isolation pattern defining an active region in a semiconductor substrate;
a word line crossing the active region in the semiconductor substrate;
a first impurity region in the active region and on one side of the word line;
a second impurity region in the active region and on another side of the word line;
a bit line crossing across the semiconductor substrate and connected to the first impurity region;
a landing pad on the second impurity region;
a storage node contact connecting the landing pad to the second impurity region;
a bottom electrode on the landing pad, the bottom electrode including a conductive oxide; and
a dielectric layer that covers the bottom electrode,
wherein the landing pad includes
a first conductive pattern including a first metal,
a second conductive pattern on the first conductive pattern and including a nitride of a second metal, and
an interface layer on a top surface of the second conductive pattern, the interface layer including an oxynitride of the second metal,
wherein an oxygen concentration of the interface layer decreases in a direction toward the second conductive pattern from a top surface of the interface layer.

13. The semiconductor device of claim 12, wherein an entire bottom surface of the bottom electrode is in contact with the interface layer.

14. The semiconductor device of claim 12, wherein the interface layer includes a dopant with a valence electron number different from a valence electron number of the second metal.

15. The semiconductor device of claim 14, wherein
the second metal includes at least one of titanium (Ti) or tantalum (Ta), and
the dopant includes niobium (Nb).

16. The semiconductor device of claim 12, wherein the second conductive pattern includes a dopant.

17. The semiconductor device of claim 12, wherein the first metal includes tungsten (W).

18. The semiconductor device of claim 12, wherein
the bottom electrode is coupled to the interface layer, and
the interface layer separates the bottom electrode from the second conductive pattern.

* * * * *